US012720796B2

(12) United States Patent
Jao et al.

(10) Patent No.: US 12,720,796 B2
(45) Date of Patent: Aug. 25, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Meng-Huan Jao, Taichung City (TW); Lin-Yu Huang, Hsinchu (TW); Huan-Chieh Su, Tianzhong Township, Changhua County (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 673 days.

(21) Appl. No.: 17/870,161

(22) Filed: Jul. 21, 2022

(65) Prior Publication Data

US 2024/0030301 A1 Jan. 25, 2024

(51) Int. Cl.
*H10D 30/62* (2025.01)
*H10D 64/01* (2025.01)

(52) U.S. Cl.
CPC ......... *H10D 30/6219* (2025.01); *H10D 64/01* (2025.01)

(58) Field of Classification Search
CPC ............. H01L 29/401; H01L 29/42392; H01L 29/78696; H01L 29/66439; H01L 29/785; H01L 29/66795; H01L 21/76829–76834; H10D 30/6219; H10D 64/01; H10D 30/6757; H10D 30/62; H10D 30/014; H10D 30/024; H10D 30/6735; H10D 30/501–509
See application file for complete search history.

(56) References Cited

U.S. PATENT DOCUMENTS 9,209,247 B2 12/2015 Colinge et al.
9,236,267 B2 1/2016 De et al.
9,312,356 B1 * 4/2016 Lin ...................... H10D 64/667
9,412,817 B2 8/2016 Yang et al.
9,412,828 B2 8/2016 Ching et al.
9,472,618 B2 10/2016 Oxland
9,502,265 B1 11/2016 Jiang et al.
9,502,310 B1 * 11/2016 Li ...................... H10D 84/0195
9,520,482 B1 12/2016 Chang et al.
(Continued)

FOREIGN PATENT DOCUMENTS

CN 110718465 A * 1/2020 ............. H10D 30/62
CN 114551597 A * 5/2022 ........... H10D 30/024

*Primary Examiner* — Chad M Dicke
*Assistant Examiner* — Gary Abel
(74) *Attorney, Agent, or Firm* — Birch, Stewart, Kolasch & Birch, LLP

(57) ABSTRACT

Semiconductor structures and methods for forming the same are provided. The semiconductor structure includes a gate structure formed over a substrate, and a source/drain (S/D) structure formed adjacent to the gate structure. The semiconductor structure includes a gate spacer formed adjacent to the gate structure, and an etching stop layer adjacent to the gate spacer. The semiconductor structure also includes a gate mask layer formed over the gate structure, and a topmost surface of the gate mask layer is higher than a top surface of the etching stop layer.

20 Claims, 36 Drawing Sheets

(56) References Cited

U.S. PATENT DOCUMENTS 9,536,738 B2 1/2017 Huang et al.
9,576,814 B2 2/2017 Wu et al.
9,608,116 B2 3/2017 Ching et al.
9,660,084 B2 * 5/2017 Wu .................... H10D 84/038
2006/0154423 A1 * 7/2006 Fried .................... H10D 30/024
438/286
2017/0352744 A1 * 12/2017 Basker ................. H10D 30/024
2018/0301564 A1 * 10/2018 Kwon ................ H10D 30/6713
2020/0357911 A1 * 11/2020 Frougier ................ B82Y 10/00
2021/0043747 A1 * 2/2021 Cheng .............. H10D 64/01354
2021/0091194 A1 * 3/2021 Hourani ............ H01L 21/76834
2021/0091232 A1 * 3/2021 Yang .................. H10D 30/6735
2021/0202512 A1 * 7/2021 Hsu ........................ H10B 41/30
2021/0359103 A1 * 11/2021 Xie ...................... H10D 64/018
2023/0053379 A1 * 2/2023 Choi .................... H10D 30/014
2023/0135946 A1 * 5/2023 Weng ................. H10D 30/0227
438/299
2023/0207560 A1 * 6/2023 Bomberger .......... H10D 84/038
257/288
2024/0347635 A1 * 10/2024 Chiang .............. H10D 30/6757

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 2N' shows a cross-sectional view of a semiconductor structure, in accordance with some embodiments.

DETAILED DESCRIPTION

Figure 1A:
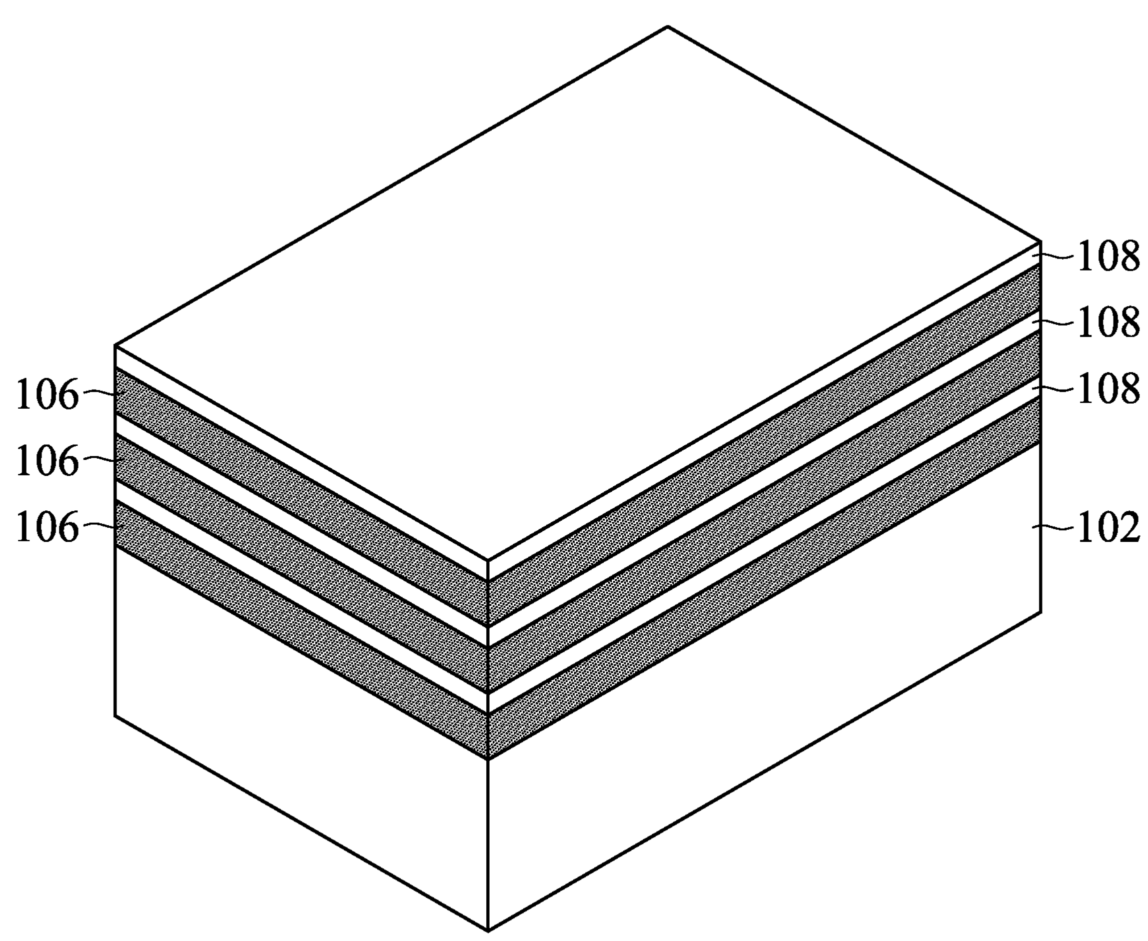
FIGS. 1A to 1E show perspective views of intermediate stages of forming a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structure includes a gate structure formed over a substrate and a source/drain (S/D) structure formed adjacent to the gate structure. An S/D contact structure is formed over the S/D structure. A gate mask layer is formed over the gate structure, and the gate mask layer is formed by a bottom-up process, such as ALD process. In addition, an S/D mask layer is formed over the S/D contact structure, and the S/D mask layer is also formed by a bottom-up process, such as ALD process. Therefore, no seam or void is formed in the gate mask layer and in the S/D mask layer, and the some issue caused by the seam or void can be resolved. Accordingly, the performance of the semiconductor structure is improved. Source/drain (S/D) structure or S/D region(s) may refer to a source or a drain, individually or collectively dependent upon the context.

FIGS. 1A to 1E show perspective views of intermediate stages of forming a semiconductor structure 100*a*, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials.

In some embodiments, the first semiconductor layers 106 and the second semiconductor layers 108 independently include silicon (Si), germanium (Ge), silicon germanium ($Si_{1-x}$Gex, 0.1<x<0.7, the value x is the atomic percentage of germanium (Ge) in the silicon germanium), indium arsenide (InAs), indium gallium arsenide (InGaAs), indium antimonide (InSb), or another applicable material.

The first semiconductor layers 106 and the second semiconductor layers 108 are made of different materials having different lattice constant. In some embodiments, the first semiconductor layer 106 is made of silicon (Si), and the second semiconductor layer 108 is made of silicon germanium ($Si_{1-x}$Gex, 0.1<x<0.7). In some other embodiments, the first semiconductor layer 106 is made of silicon germanium ($Si_{1-x}$Gex, 0.1<x<0.7), and the second semiconductor layer 108 is made of silicon (Si).

It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
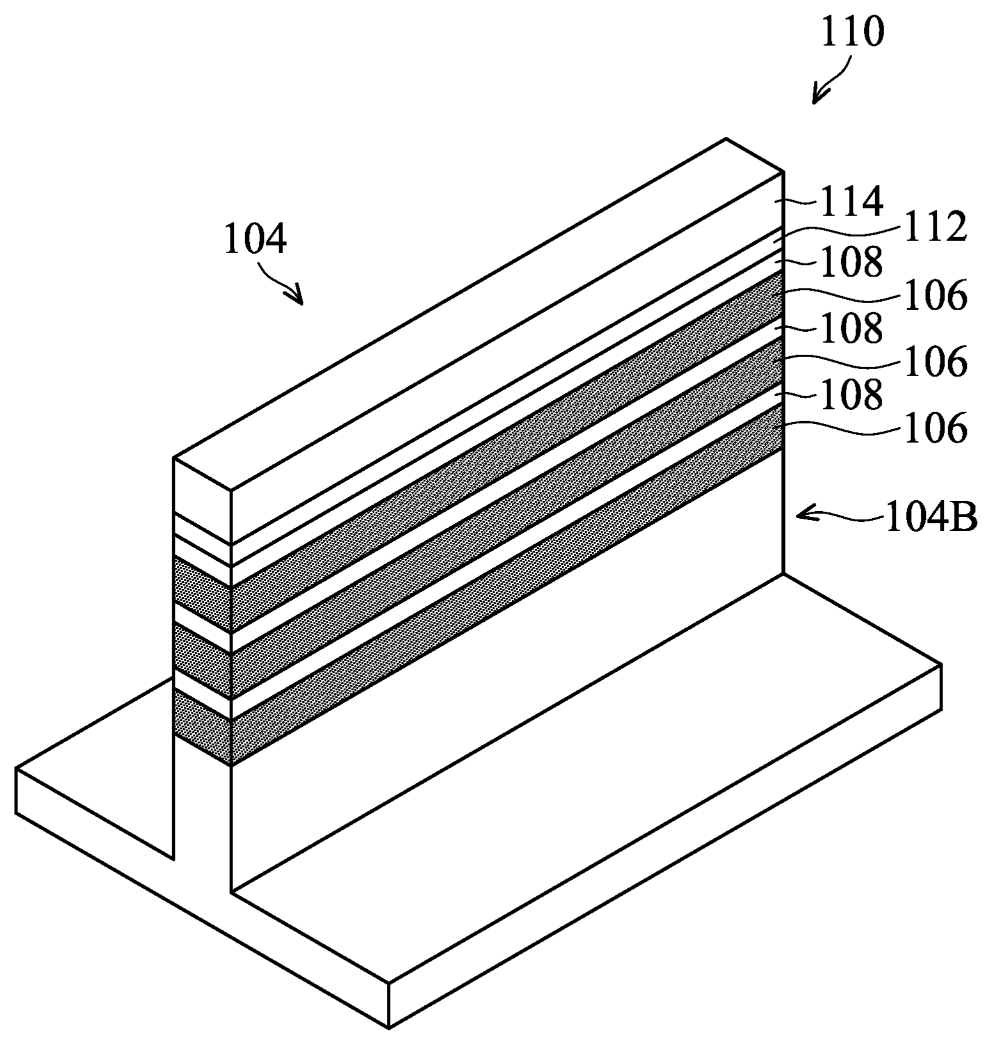

As shown in FIG. 1B, after the first semiconductor material layers 106 and the second semiconductor material layers 108 are formed as a semiconductor material stack over the substrate 102, the semiconductor material stack is patterned to form a fin structure 104, in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
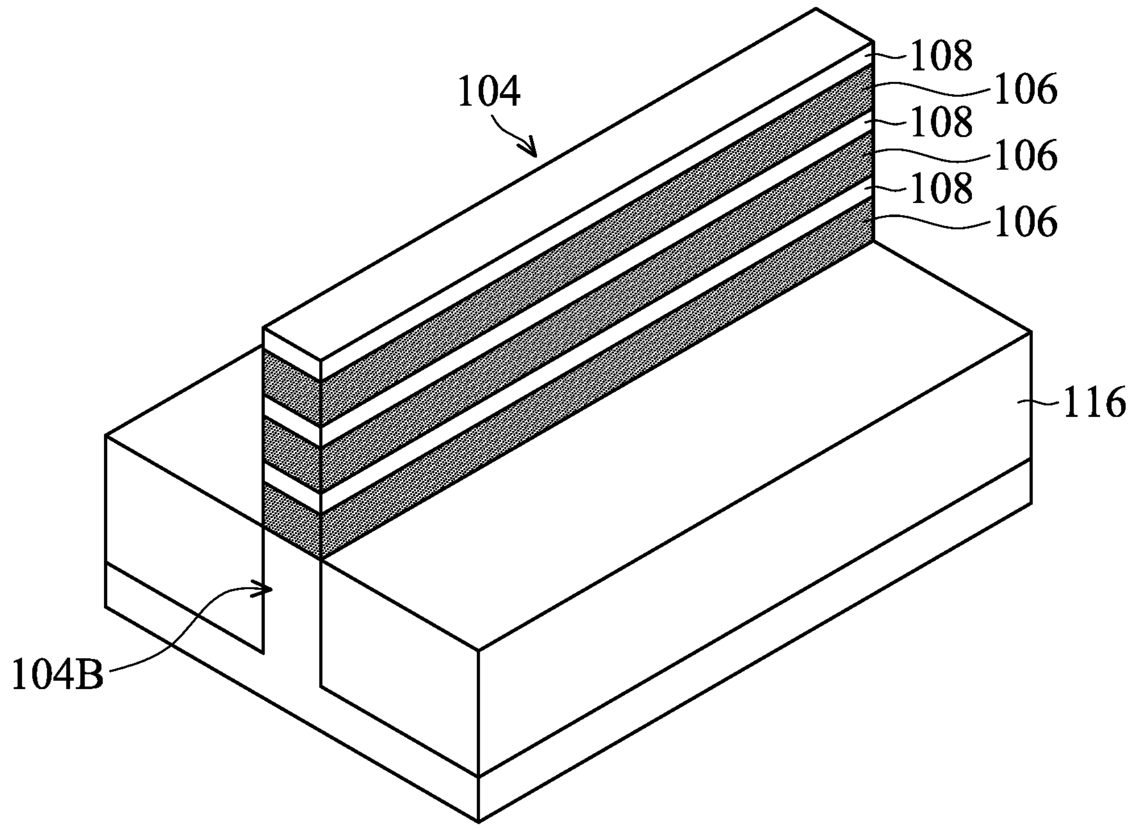

As shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
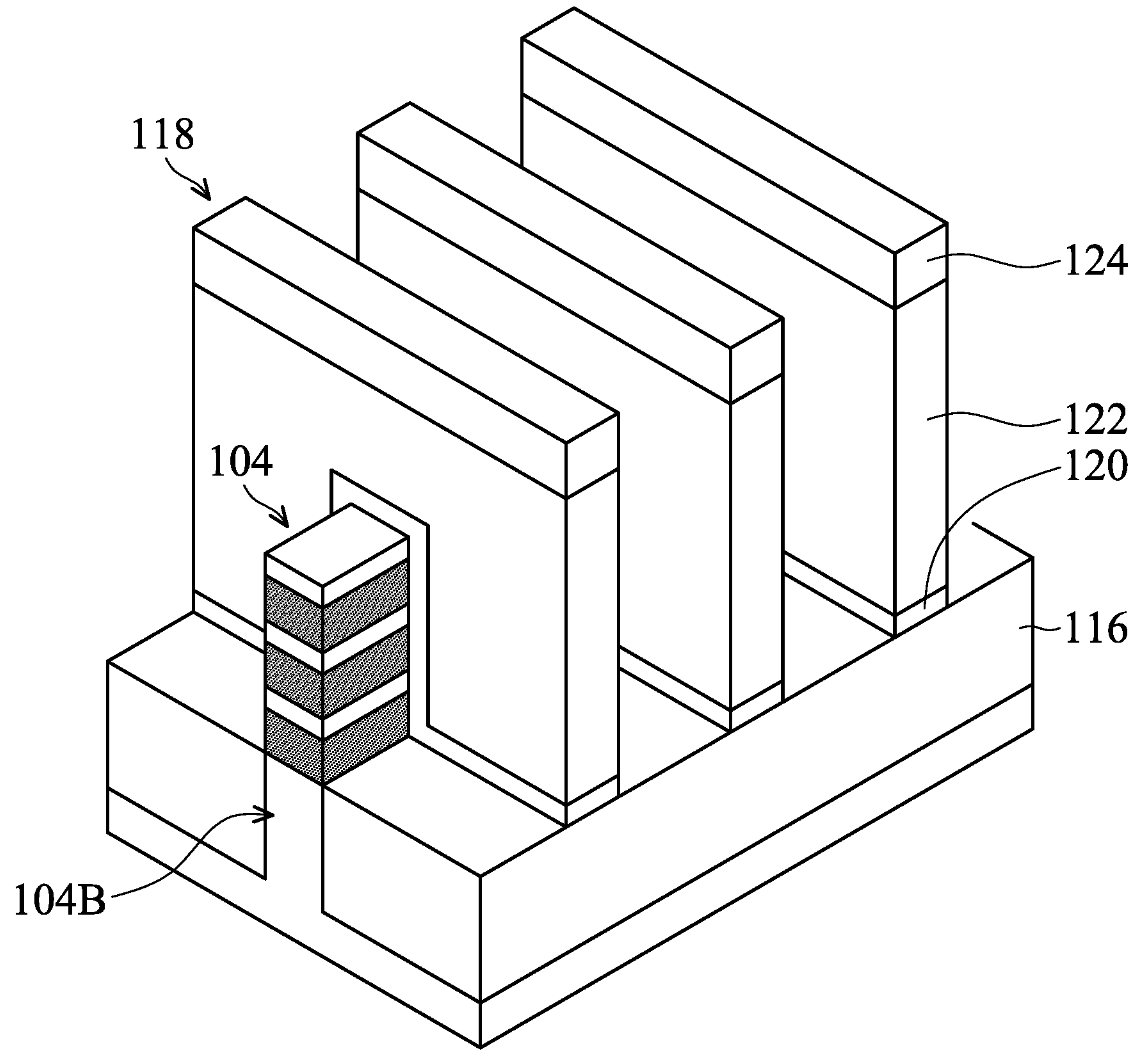

As shown in FIG. 1D, after the isolation structure 116 is formed, dummy gate structures 118 are formed across the fin structure 104 and extend over the isolation structure 116, in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic layer deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, the hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
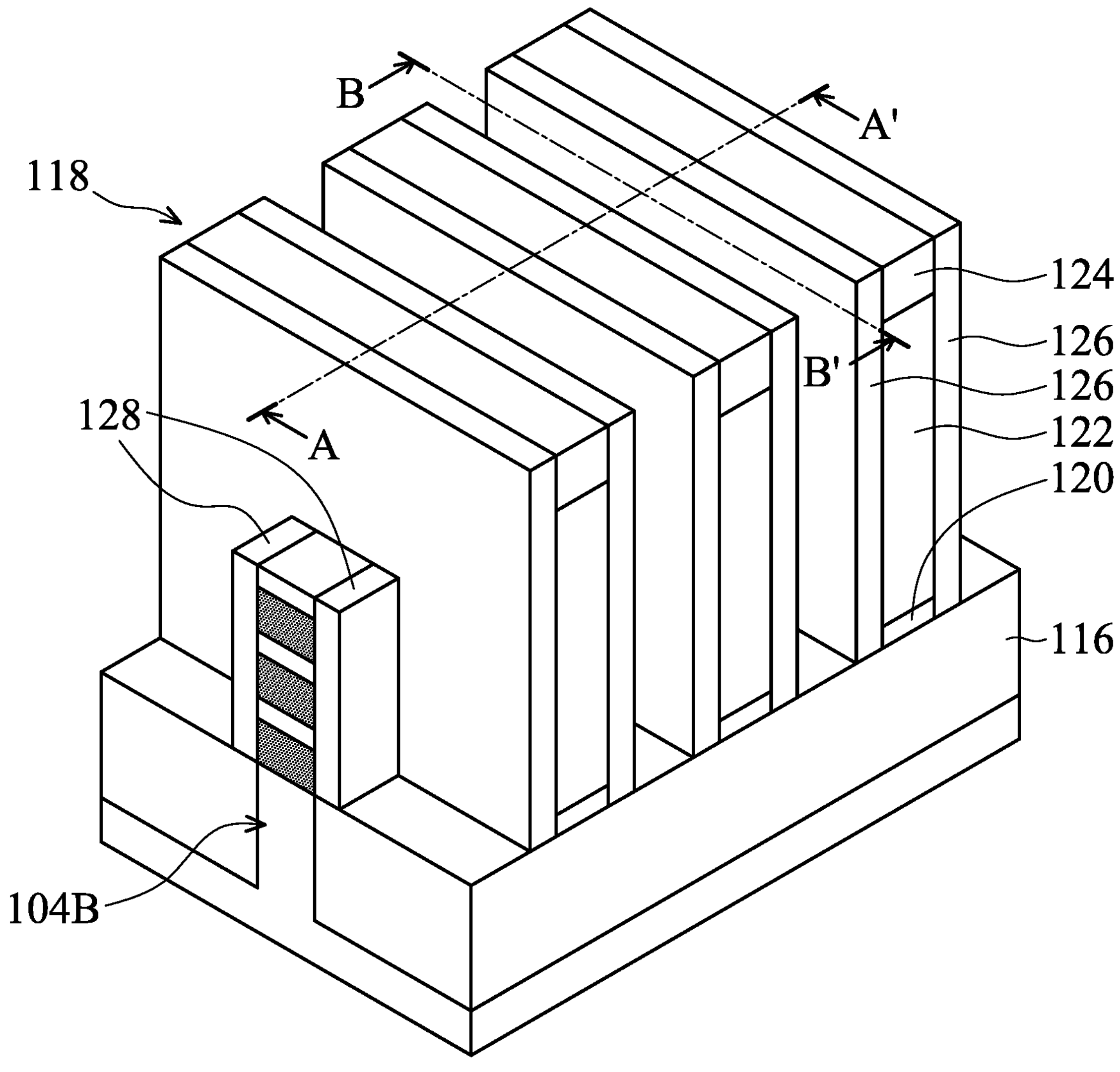

As shown in FIG. 1E, after the dummy gate structures 118 are formed, gate spacers 126 are formed along, and cover, opposite sidewalls of the dummy gate structure 118, and fin spacers 128 are formed along, and cover, opposite sidewalls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain the lateral growth of a subsequently formed source/drain structure and to support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figure 2A:
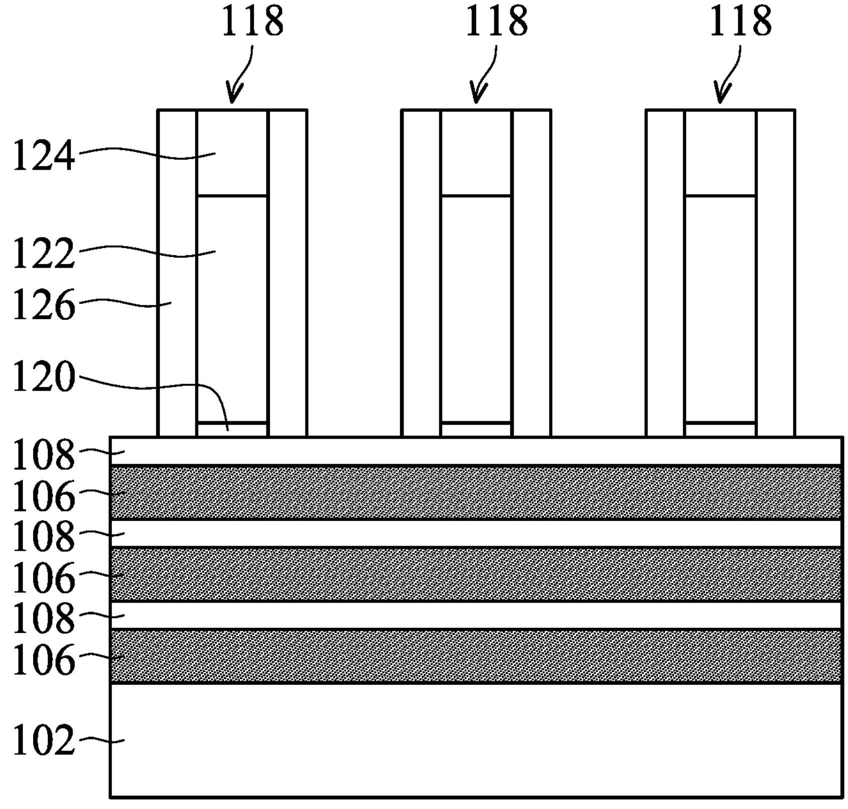
FIGS. 2A to 2N show cross-sectional representations of various stages of forming the semiconductor structure shown along line A-A' in FIG. 1E, in accordance with some embodiments.
Figure 2B:
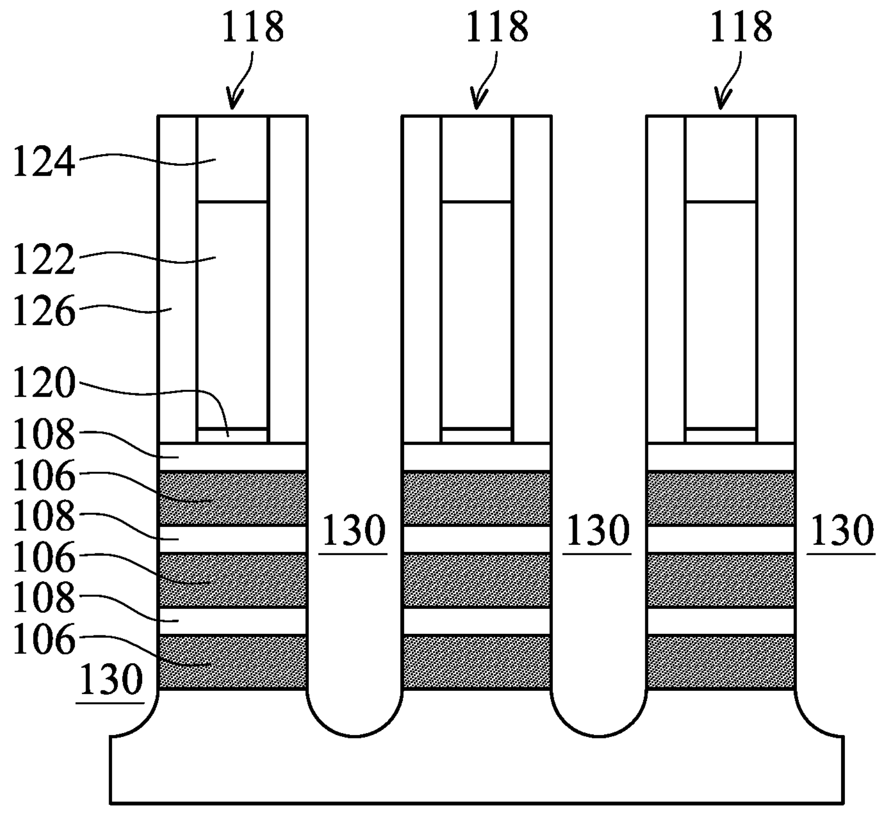
Figure 2C:
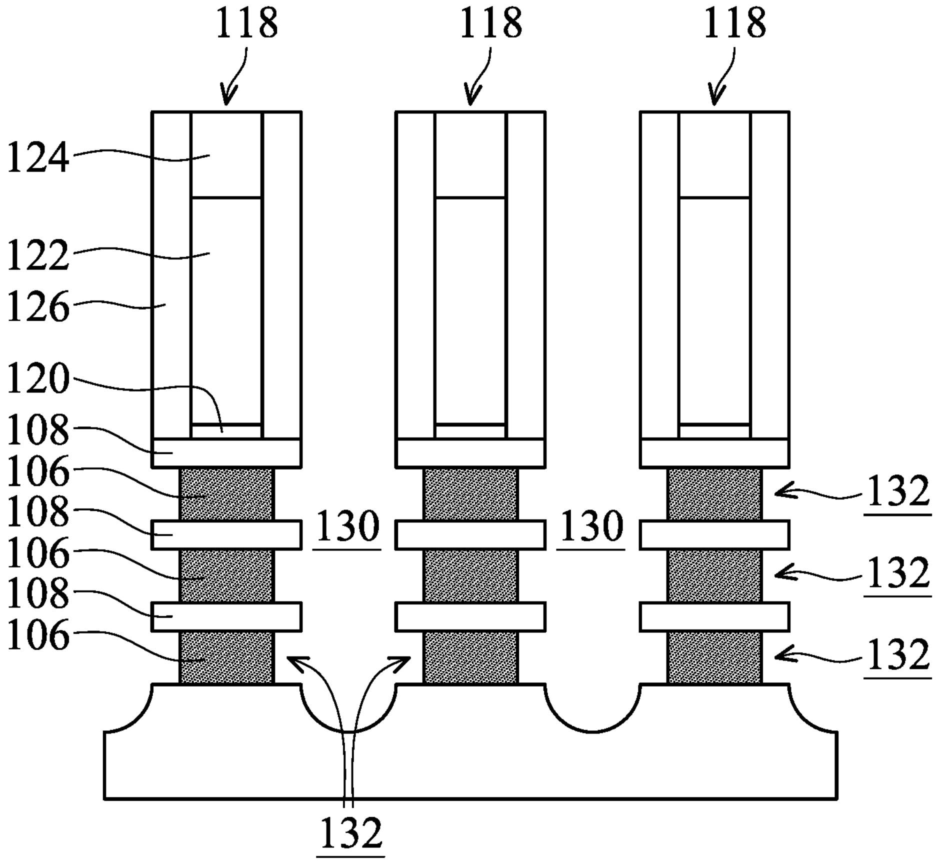
Figure 2D:
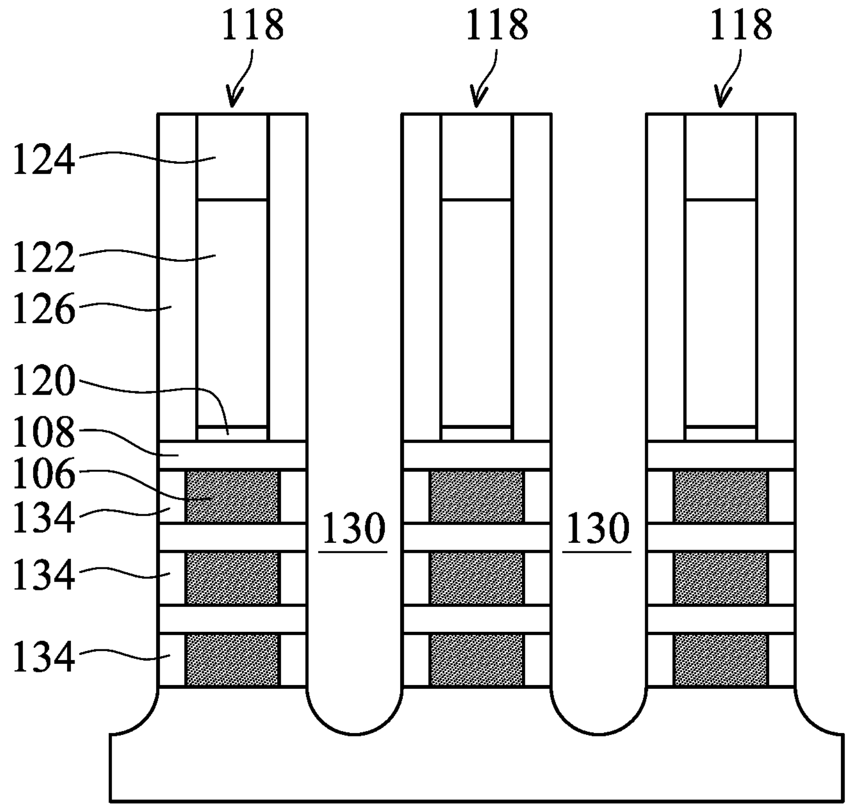
Figure 2E:
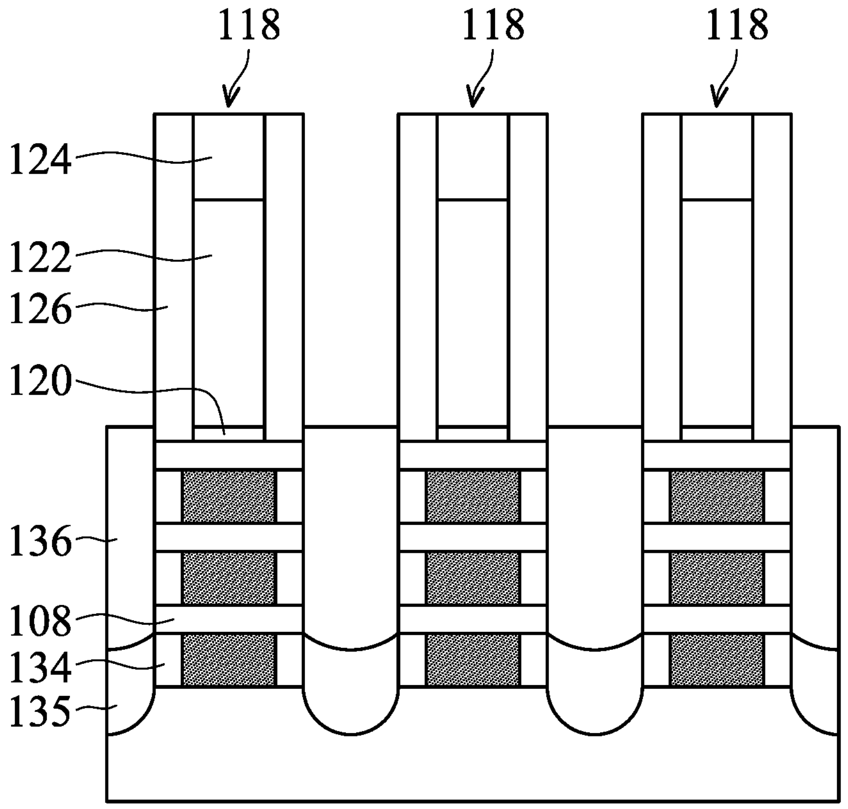
Figure 2F:
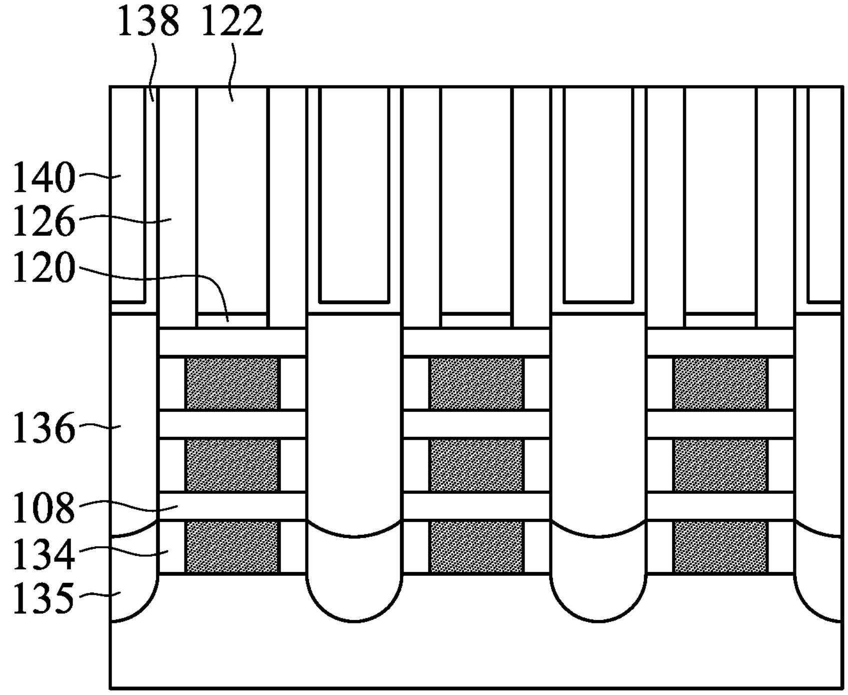
Figure 2G:
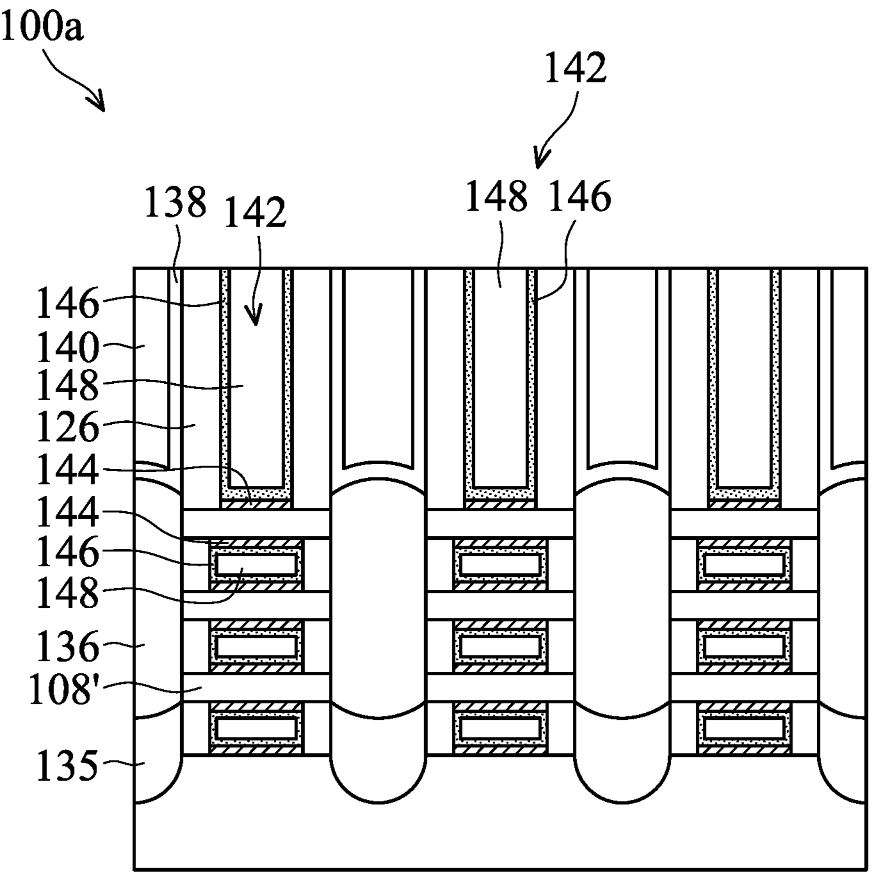
Figure 2H:
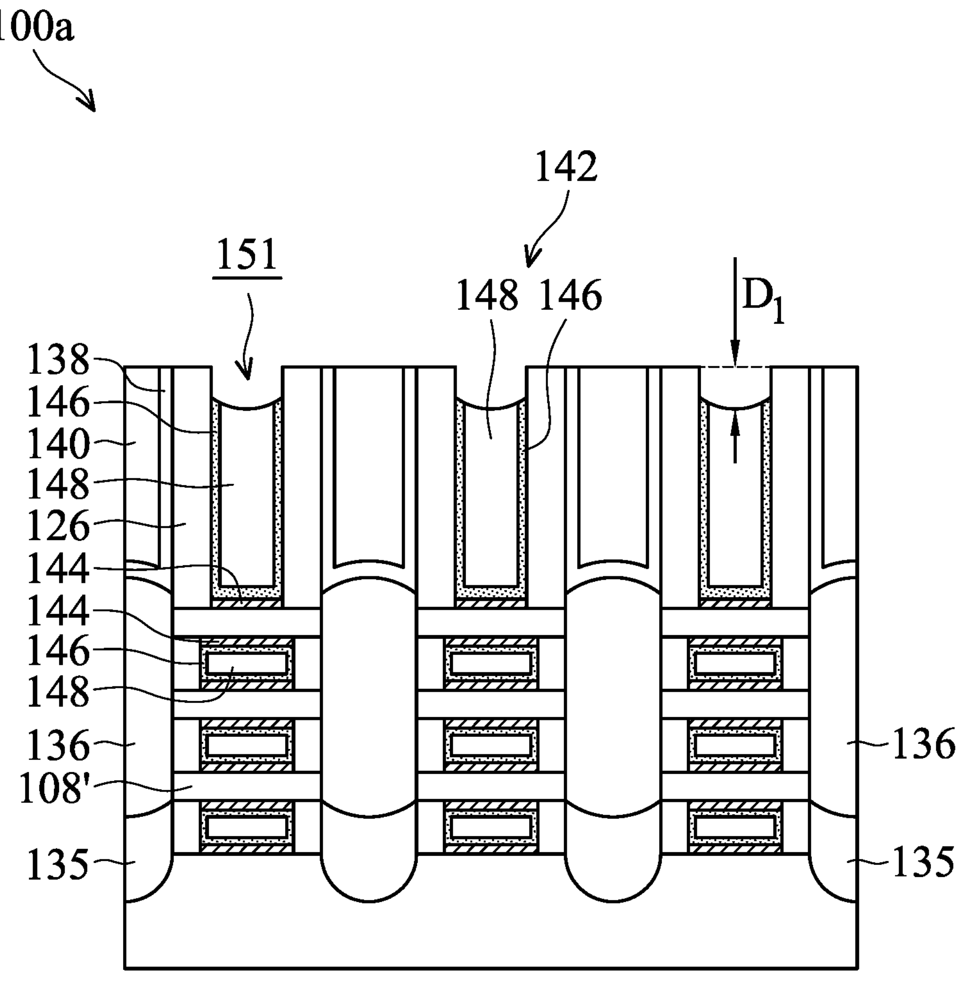
Figure 2I:
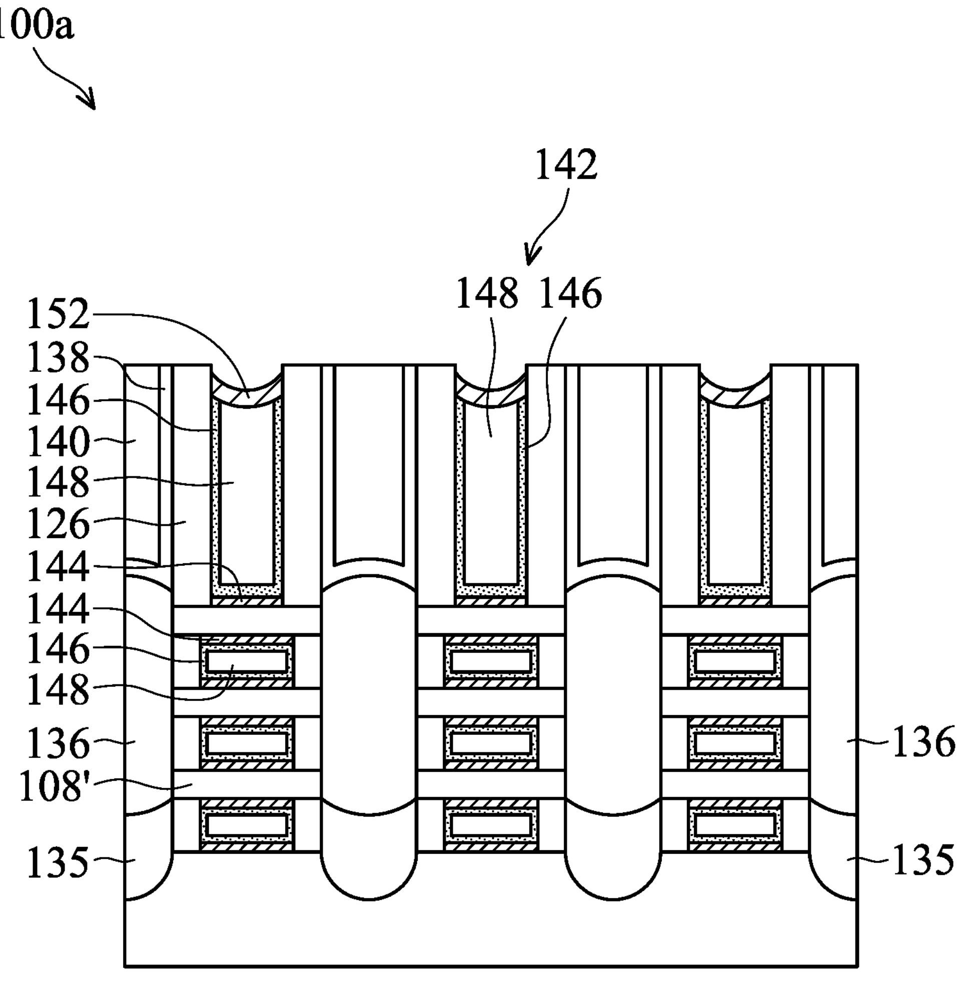
Figure 2J:
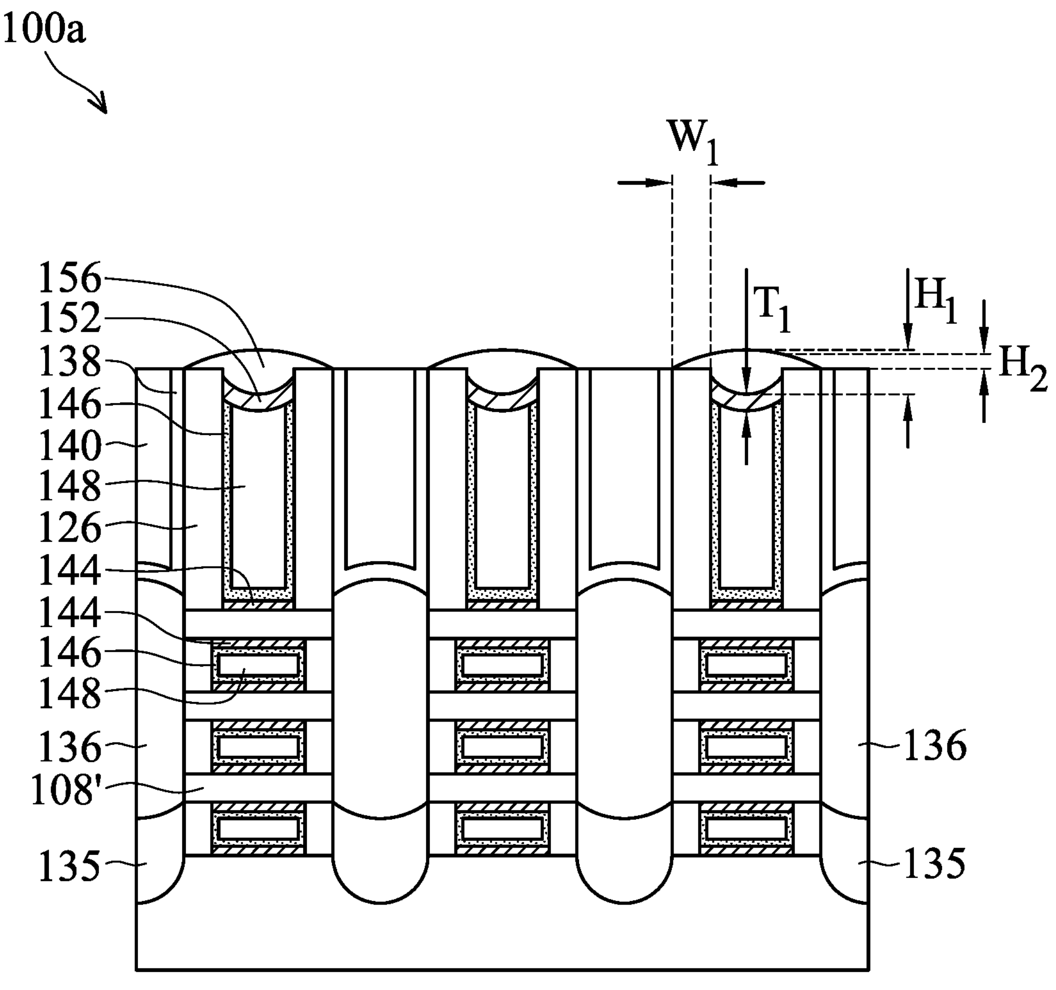
Figure 2K:
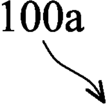
Figure 2K:
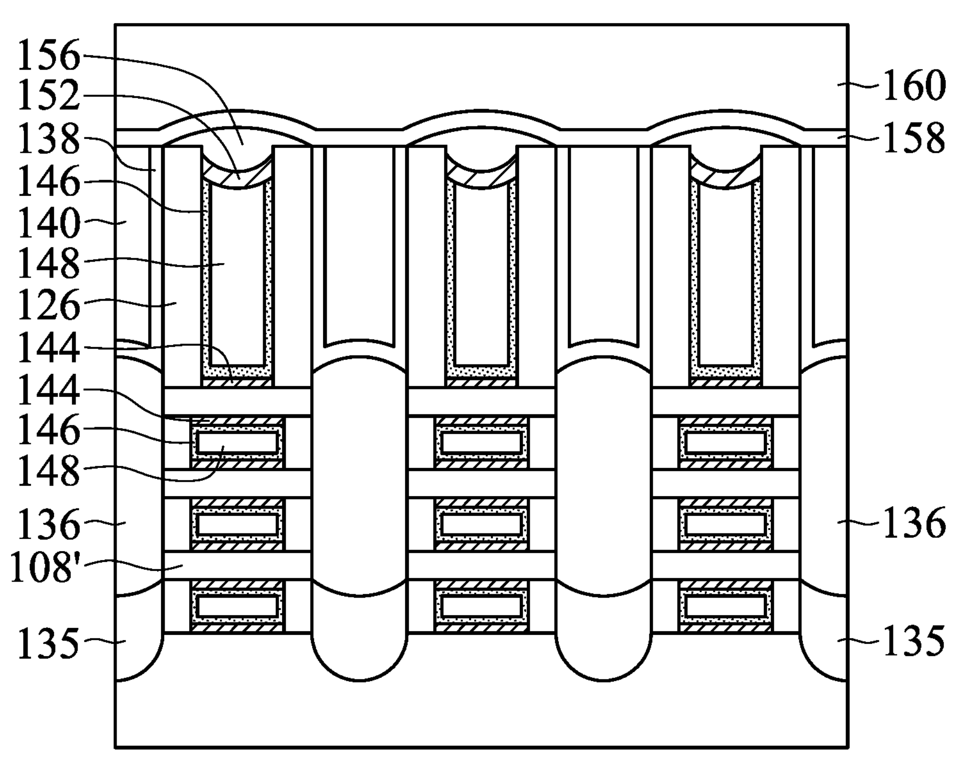
Figure 2L:
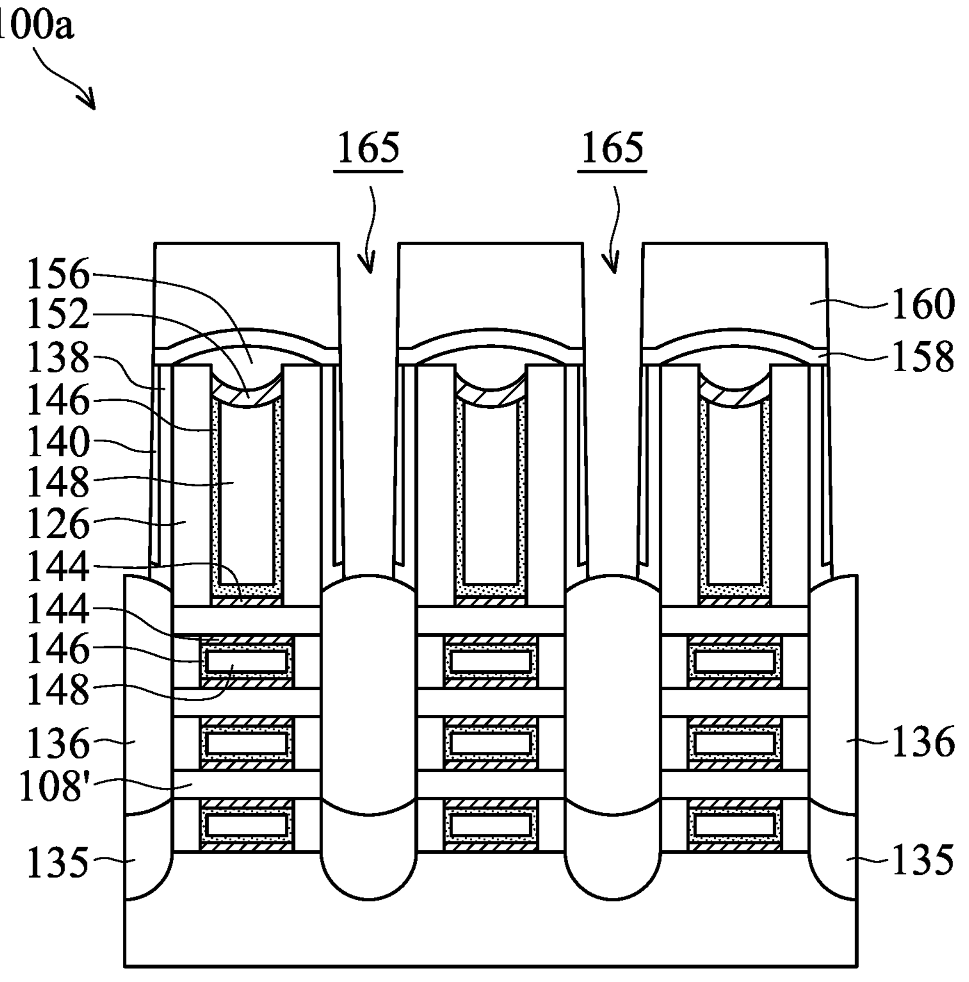
Figure 2M:
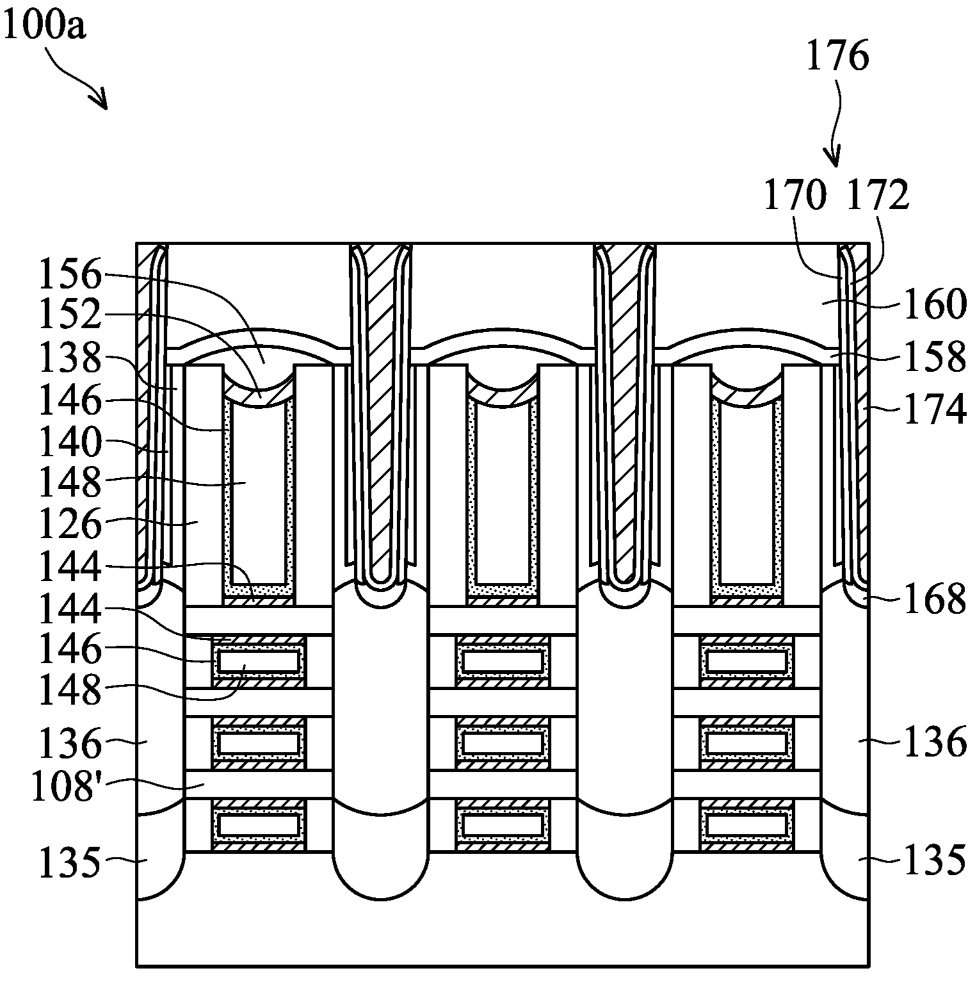
Figure 2N:
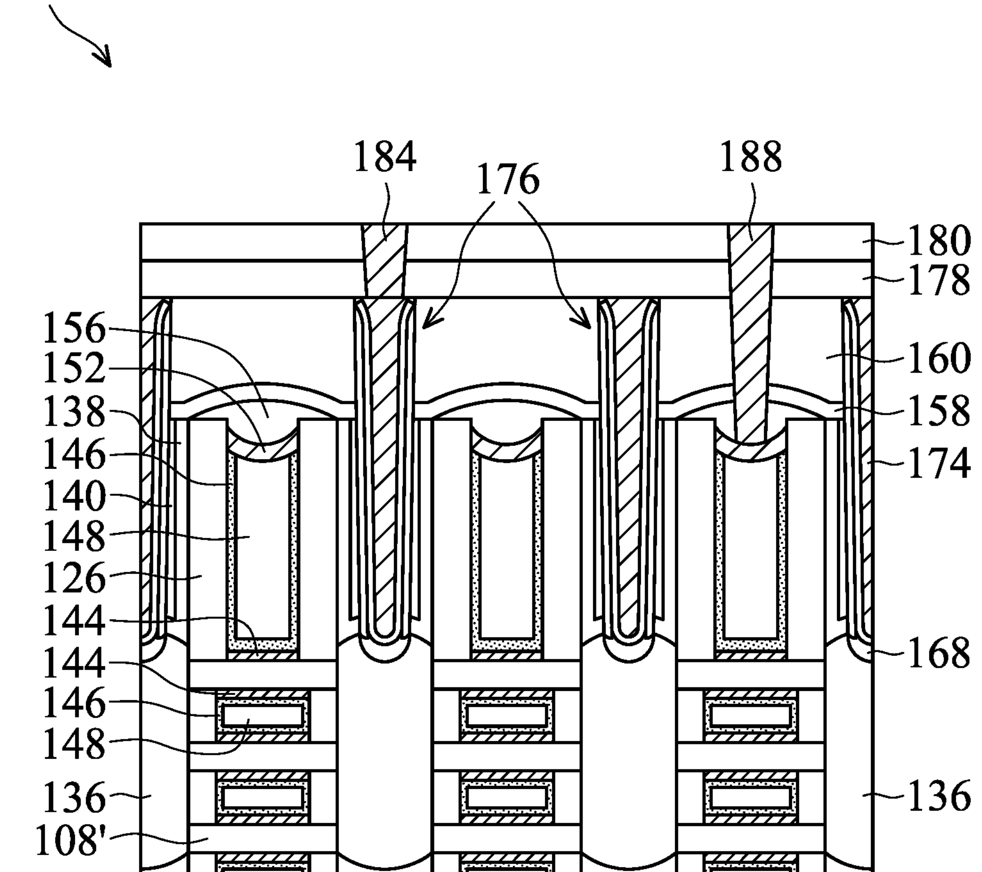
Figure 2N:
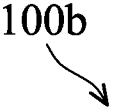
Figure 2N:
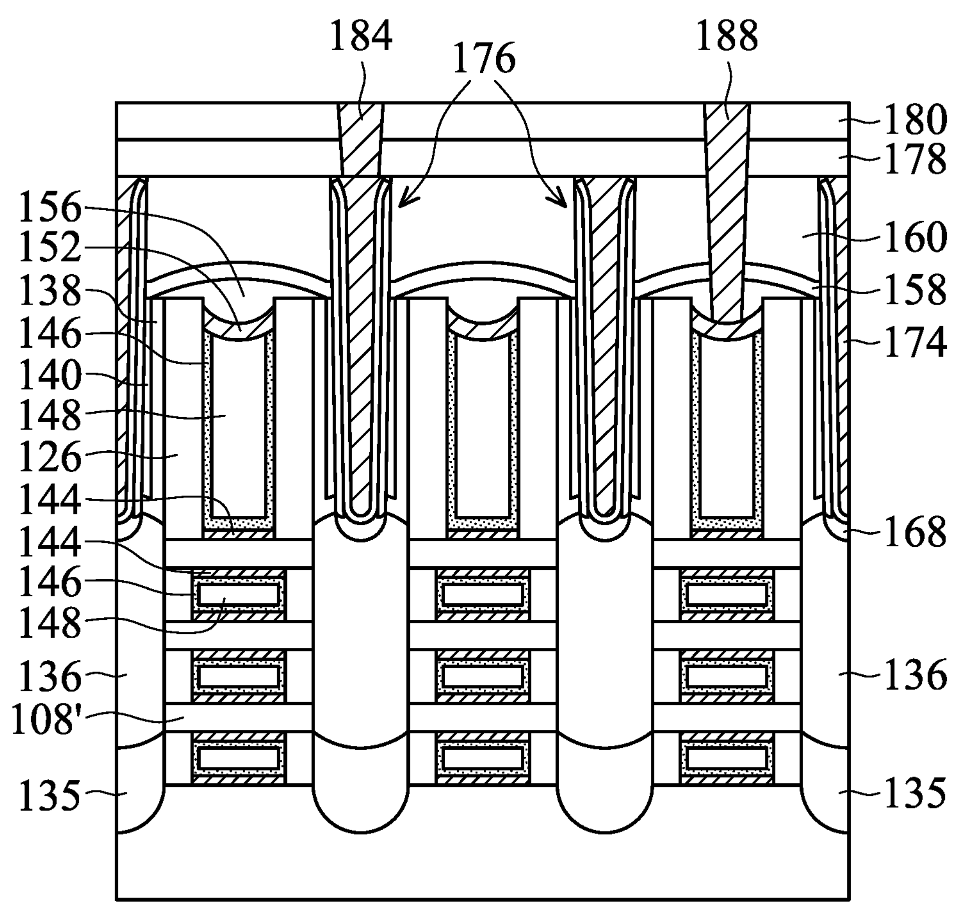

FIGS. 2A to 2N show cross-sectional representations of various stages of forming the semiconductor structure **100*a* shown along line A-A' in FIG. 1E, in accordance with some embodiments. More specifically, FIG. 2A illustrates the cross-sectional representation shown along line A-A' in FIG. 1**E in accordance with some embodiments.

As shown in FIG. 2B, after the gate spacers 126 and the fin spacers 128 are formed, the source/drain (S/D) regions of the fin structure 104 are recessed to form source/drain (S/D) recesses 130, in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

Afterwards, as shown in FIG. 2C, after the S/D recesses 130 are formed, the first semiconductor material layers 106 exposed by the S/D recesses 130 are laterally recessed to form notches 132, in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, or a combination thereof.

Next, as shown in FIG. 2D, inner spacers 134 are formed in the notches 132 between the second semiconductor material layers 108, in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIG. 2E, after the inner spacers 134 are formed, an isolation layer 135 is formed in the S/D recesses 130, and source/drain (S/D) structures 136 are formed on the isolation layer 135, in accordance with some embodiments.

The isolation layer 135 may include a dielectric material, such as a doped oxide layer, a doped carbide layer, a doped nitride layer, or undoped silicon nitride layer. The doped oxide layer may include carbon-doped silicon oxide layer, nitrogen-doped silicon oxide layer, and carbon- and nitrogen-doped silicon oxide layer. The doped carbide layer may include oxygen-doped silicon carbide layer, nitrogen-doped silicon carbide layer, and oxygen- and nitrogen-doped silicon carbide layer. The doped nitride layer may include oxygen-doped silicon nitride layer, carbon-doped silicon nitride layer, and oxygen- and carbon-doped silicon nitride layer.

In some embodiments, the top surface of the isolation layer 135 can have a curved profile. In some embodiments, the thickness of the isolation layer 135 along the Z-axis is about 5 nm to about 15 nm. Within this range of thickness, the isolation layer 135 can provide adequate electrical isolation between the S/D structures 136 and the substrate 102.

In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Next, as shown in FIG. 2F, after the S/D structures 136 are formed, an etching stop layer 138 is conformally formed to cover the S/D structures 136 and an interlayer dielectric (ILD) layer 140 is formed over the contact etch stop layers 138, in accordance with some embodiments.

In some embodiments, the etching stop layer 138 is made of a dielectric materials, such as silicon nitride, silicon oxide, silicon oxynitride, another suitable dielectric material, or a combination thereof. The dielectric material for the etching stop layer 138 may be conformally deposited over the semiconductor structure by performing chemical vapor deposition (CVD), ALD, other application methods, or a combination thereof. In some embodiments, the etching stop layer 138 has a thickness in a range from about 1 nm to about 5 nm.

The ILD layer 140 may include multilayers made of multiple dielectric materials, such as silicon oxide, silicon nitride, silicon oxynitride, phosphosilicate glass (PSG), borophosphosilicate glass (BPSG), or another applicable low-k dielectric material. The ILD layer 140 may be formed by chemical vapor deposition (CVD), physical vapor deposition, (PVD), atomic layer deposition (ALD), or another applicable process.

After the etching stop layer 138 and the ILD layer 140 are deposited, a planarization process such as CMP or an etch-back process may be performed until the gate electrode layers 120 of the dummy gate structures 118 are exposed, as shown in FIG. 2F in accordance with some embodiments.

Afterwards, as shown in FIG. 2G, the dummy gate structures 118 are replaced by a gate structure 142, in accordance with some embodiments. More specifically, the dummy gate structures 118 and the first semiconductor material layers 106 are removed to form nanostructures 108' with the second semiconductor material layers 108, in accordance with some embodiments. The S/D structure 136 is attached to the nanostructures 108'.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacers 126 are also removed.

After the nanostructures 108' are formed, the gate structures 142 are formed wrapped around the nanostructures 108'. The gate structures 142 wrap around the nanostructures 108' to form gate-all-around transistor structures in accordance with some embodiments. In some embodiments, the gate structure 142 includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layer 146 is formed over the interfacial layers 144, so that the nanostructures 108' are surrounded (e.g. wrapped) by the gate dielectric layer 146. In addition, the gate dielectric layer 146 also covers the sidewalls of the gate spacers 126 and the inner spacers 134 in accordance with some embodiments. In some embodiments, the gate dielectric layer 146 is made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layer 146 is formed using chemical vapor deposition (CVD), atomic layer deposition (ALD), another applicable method, or a combination thereof.

In some embodiments, the gate electrode layer 148 is formed on the gate dielectric layer 146. In some embodiments, the gate electrode layer 148 is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 148 is formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layer 146, and the gate electrode layer 148 are formed, a planarization process such as CMP or an etch-back process may be performed until the ILD layer 140 is exposed.

Afterwards, as shown in FIG. 2H, a top portion of the gate electrode layer 148 and a top portion of the gate dielectric layer 146 of the gate structure 142 are removed to form an opening 151, in accordance with some embodiments. As a result, the opening 151 has a curved bottom surface.

In some embodiments, the top portion of the gate electrode layer 148 and a top portion of the gate dielectric layer 146 of the gate structure 142 are removed by an etching process, such as a wet or dry etching process.

The opening 151 has a first depth $D_1$ which is measured from the top surface of the gate spacer 126 to the bottommost surface of the opening 151. In some embodiments, the first depth $D_1$ of the opening 151 is in a range from about 1 nm to about 10 nm.

Next, as shown in in FIG. 2I, a conductive cap layer 152 is formed in the opening 151, in accordance with some embodiments. The conductive cap layer 152 is configured to provide conductive interfaces between the gate structure 142 and a gate conductive via (188, FIG. 2N, formed later) to electrically connect the gate contact structure gate contact structure to the gate structure 142.

In some embodiments, the conductive cap layer 152 can include a metallic material, such as tungsten (W), ruthenium (Ru), molybdenum (Mo), cobalt (Co), other suitable metallic materials, and a combination thereof.

In some embodiments, the conductive cap layer 152 is made of Ru, and a precursor gas used in the bottom-up deposition process includes $Ru(CO)_5$, $Ru_3(CO)_{12}$, $RuCl_3$, $Ru(od)_3$, Bis(cyclopentadienyl)ruthenium(II), $Ru(CO)_3C_6H_8$, $Ru(CO)_2(tmhd)_2$, $Ru(EtCp)_2$, $Ru(CO)_2(acac)_2$, $Ru(C_6H_6)(C_6H_8)$, $Ru(DMBD)(CO)_3$, a combination thereof, or the like. In some embodiments, conductive cap layer 152 is made of W, and a precursor gas used in the bottom-up deposition process includes $W(CO)_6$, $W(F)_6$, or the like. In some embodiments, the conductive cap layer 152 is made of Mo, and a precursor gas used in the bottom-up deposition process includes $MoF_6$, $Mo(CO)_6$, $MoCl_5$, $MoO_xCl_y$, or the like. In some embodiments, the conductive cap layer 152 has a thickness in a range from about 1 nm to about 5 nm.

Afterwards, as shown in in FIG. 2J, a gate mask layer 156 is formed on the conductive cap layer 152, in accordance with some embodiments. The gate mask layer 156 is a protection layer to protect the underlying layers, such as gate structure 142. In other words, the conductive cap layer 152 is below the gate mask layer 156.

In some embodiments, the gate mask layer 156 is mainly formed on the conductive cap layer 152. In some embodiments, the gate mask layer 156 extends to the top surface of the gate spacer 126. In some other embodiments, the gate mask layer 156 further extends to the top surface of the etching stop layer 138 and the ILD layer 140.

Since the gate mask layer 156 is deposited by a bottom up process which is formed from bottom to top, no seam or void exists in the gate mask layer 156. If the seam or void is formed in the gate mask layer 156, the conductive material in the subsequent process may fill into the seam or void, the unwanted conductive material in the gate mask layer 156 may degrade the etching process during removing the gate mask layer 156 to form the gate conductive via 188 (formed latera, in FIG. 2N). Therefore, in order to overcome the issue caused by the seam or void, the gate mask layer 156 is formed by the bottom up process to have a seam-free or void-free structure.

In some embodiments, the gate mask layer 156 is made of SiOx, SiOC, AlxOy, AlON, ZrO, HfO, TiO, ZrAlO, ZnO, SiOCN, SiOCN, SiCN or another applicable material. In some embodiments, the gate mask layer 156 is formed by a deposition process, such as chemical vapor deposition (CVD), physical vapor deposition, (PVD), atomic layer deposition (ALD), or another applicable processes.

In some embodiments, the gate mask layer 156 is formed by a bottom up process, such as an atomic layer deposition (ALD) process. In some embodiments, the ALD process is performed at a temperature in a range from about 20 degree Celsius (° C.) to about 50 degree Celsius (° C.). In some embodiments, the ALD process is performed at pressure in a range from about 0.05 Torr to about 50 Torr. In some embodiments, per cycle of the ALD process is in a range from about 0.01 seconds to about 100 seconds.

In some embodiments, the gate mask layer 156 is formed by a selective growth process by using the precursor. The precursor is selectively formed on conductive material, not on the dielectric material. More specifically, the precursor is selectively formed on the conductive cap layer 152 to form the gate mask layer 156. In some embodiments, the precursor is an amphiphilic molecule. In some embodiments, the precursor includes function group, such as, alkyls, halides, alkoxides, carboxylates, amines, thiols, amidinates, sulfonic acids, thiocyanates, cyclopentadienyls, or β-diketonates.

In some embodiments, the gate mask layer 156 is formed by an inhibitor assist selective growth process by using the inhibitor. The inhibitor is formed on the dielectric material, but not on the conductive material. In some embodiments, the gate mask layer 156 is formed on conductive cap layer 152, but not formed on the dielectric material due to the formation of the inhibitor.

In some embodiments, the inhibitor is an amphiphilic molecule. In some embodiments, the inhibitor includes silane, alcohol, amine, acid, or thiol based compounds. In some embodiments, the inhibitor further includes function group, such as, alkyls, halides, alkoxides, carboxylates, amines, thiols, amidinates, sulfonic acids, thiocyanates, cyclopentadienyls, β-diketonates, or heteroleptic. In some embodiments, the inhibitor is made of dimethylaminotrimethylsilane, di(isopropylamino)silane, Octadecyltrichlorosilane, stearyl alcohol, oleylamine, decylphosphonic acid, 1-octadecanethiol.

The conductive cap layer 152 has a first thickness $T_1$ in the vertical direction. The gate mask layer 156 has a middle portion and a sidewall portion, the middle portion has a first height $H_1$, and the sidewall portion has a second height $H_2$. The first height $H_1$ is greater than the second height $H_2$.

The gate mask layer 156 has a lateral thickness $W_1$ which is laterally formed on the top surface of the gate spacer 126 along a horizontal direction. In some embodiments, the first thickness $T_1$ of the conductive cap layer 152 is in a range from about 1 nm to about 5 nm. In some embodiments, the first height $H_1$ of the gate mask layer 156 is in a range from about 1 nm to about 15 nm. In some embodiments, the lateral thickness $W_1$ of the gate mask layer 156 is in a range from about 1 nm to about nm.

Next, as shown in in FIG. 2K, an etching stop layer 158 is formed over the gate mask layer 156, the gate spacer 126, the etching stop layer 138 and the ILD layer 140, in accordance with some embodiments. Next, a dielectric layer 160 is formed over the etching stop layer 158.

In some embodiments, before the etching stop layer 158 is formed, an implantation process is performed on the gate mask layer 156. The implantation process is performed by using the germanium (Ge). After the implantation process, the gate mask layer 156 and the gate spacer 126 are doped with germanium (Ge). The germanium (Ge) can improve the adhesion between the gate mask layer 156 and the etching stop layer 158.

It should be noted that the gate mask layer 156 is formed from bottom to up process, and therefore the deposition thickness of the gate mask layer 156 is controlled by the deposition cycle of the ALD process and is not over-deposited. Accordingly, no additional CMP process is performed after the bottom-up process that formed the gate mask layer 156 and before the etching stop layer 158 is formed.

In some embodiments, the etching stop layer 158 is made of a dielectric material, such as silicon nitride, silicon oxide, silicon oxynitride, another suitable dielectric material, or a combination thereof. The dielectric material for the etching stop layer 158 may be conformally deposited over the semiconductor structure by performing chemical vapor deposition (CVD), ALD, other application methods, or a combination thereof. In some embodiments, the etching stop layer 158 has a thickness in a range from about 1 nm to about 5 nm.

The dielectric layer 160 may include multilayers made of multiple dielectric materials, such as silicon oxide, silicon nitride, silicon oxynitride, phosphosilicate glass (PSG), borophosphosilicate glass (BPSG), or another applicable low-k dielectric material. The dielectric layer 160 may be formed by chemical vapor deposition (CVD), physical vapor deposition, (PVD), atomic layer deposition (ALD), or another applicable process.

Next, as shown in in FIG. 2L, a portion of the dielectric layer 160, a portion of the etching stop layer 158, a portion of the ILD layer 140 and a portion of the etching stop layer 138 are removed to form a trench 165, in accordance with some embodiments. As a result, the top surface of the S/D structure 136 is exposed. In some embodiments, the portion of the dielectric layer 160, the portion of the etching stop layer 158, the portion of the ILD layer 140 and the portion of the etching stop layer 138 are removed using a photolithography process and a number of etching process.

Afterwards, as shown in in FIG. 2M, a silicide layer 168 is formed over the S/D structure 136, and an S/D contact structure 176 is formed over the silicide layer 168, in accordance with some embodiments. The S/D contact structure 176 includes a barrier layer 170, a glue layer 172 and a conductive layer 174.

The silicide layers 168 may be formed by forming a metal layer over the top surface of the S/D structures 136 and annealing the metal layer so the metal layer reacts with the S/D structures 136 to form the silicide layers 168. The unreacted metal layer may be removed after the silicide layers 168 are formed.

In some embodiments, the barrier layer 170 is made of silicon nitride, although any other applicable dielectric may be used as an alternative. In some embodiments, the glue layer 172 is made of tantalum nitride, although other materials, such as tantalum, titanium, titanium nitride, or the like, may also be used. In some embodiments, the conductive layer 174 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The barrier layer 170, the glue layer 172, and conductive layer 174 of the S/D contact structure 156 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Next, as shown in in FIG. 2N, an etching stop layer 178 is formed over the S/D contact structure 176, and a dielectric layer 180 is formed over the etching stop layer 178, in accordance with some embodiments. An S/D conductive via 184 is formed over the S/D contact structure 176, and a gate conductive via 188 is formed over the conductive cap layer 152.

The S/D conductive via 184 is electrically connected to the S/D structure 136 by the S/D contact structure 176. The gate conductive via 188 passes through the gate mask layer 156 and is in direct contact with the conductive cap layer 152. The gate conductive via 188 is electrically connected to the gate structure 140 by the conductive cap layer 152.

In some embodiments, the etching stop layer 178 is made of dielectric materials, such as silicon nitride, silicon oxide, silicon oxynitride, another suitable dielectric material, or a combination thereof. The dielectric material for the etching stop layer 178 may be conformally deposited over the semiconductor structure by performing chemical vapor deposition (CVD), ALD, other application methods, or a combination thereof.

The dielectric layer 180 may include multilayers made of multiple dielectric materials, such as silicon oxide, silicon nitride, silicon oxynitride, phosphosilicate glass (PSG), borophosphosilicate glass (BPSG), or another applicable low-k dielectric material. The dielectric layer 180 may be formed by chemical vapor deposition (CVD), physical vapor deposition, (PVD), atomic layer deposition (ALD), or another applicable process.

In some other embodiments, the S/D conductive via 184 includes a barrier layer (not shown) and a glue layer (not shown). In some other embodiments, the gate conductive via 188 includes a barrier layer (not shown) and a glue layer (not shown).

In some embodiments, the S/D conductive via 184 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the S/D conductive via 184 is formed by a chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the gate conductive via 188 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the gate conductive via 188 is formed by a chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the topmost surface of the gate mask layer 156 is higher than the top surface of the etching stop layer 138. The gate mask layer 156 covers a portion of the top surface of the etching stop layer 138. The gate mask layer 156 has convex top surface and concave bottom surface. Since the gate mask layer 156 is formed by the bottom up process, the gate mask layer 156 has a seam-free or void-free structure. In addition, since the gate mask layer 156 has seam-free or void-free structure, removing a portion of the gate mask layer 156 to form the gate conductive via 188 becomes easier (compared with removing the gate mask layer 156 with seam or void), and therefore the reliability of the gate conductive via 188 is improved. Therefore, performance of the semiconductor structure **100*a*** is improved.

FIG. 2N' shows a cross-sectional view of a semiconductor structure **100*b*, in accordance with some embodiments. The semiconductor structure 100*b* of FIG. 2N' includes elements that are similar to, or the same as, elements of the semiconductor structure 100*a* of FIG. 2N, the difference between FIG. 2N' and FIG. 2N is that, the gate mask layer 156 further extends to cover the top surface of the etching stop layer 138. Since the gate mask layer 156 is formed in a bottom-up process, after the opening 151 is filled with the gate mask layer 156, the gate mask layer 156 may extend outside of the opening 151 and extend to cover the top surface of the etching stop layer 138. The gate mask layer 156 is over the top surface of the etching stop layer 138**.

Figure 3A:
FIGS. 3A to 3F show cross-sectional representations of various stages of forming a semiconductor structure, in accordance with some embodiments.
Figure 3A:
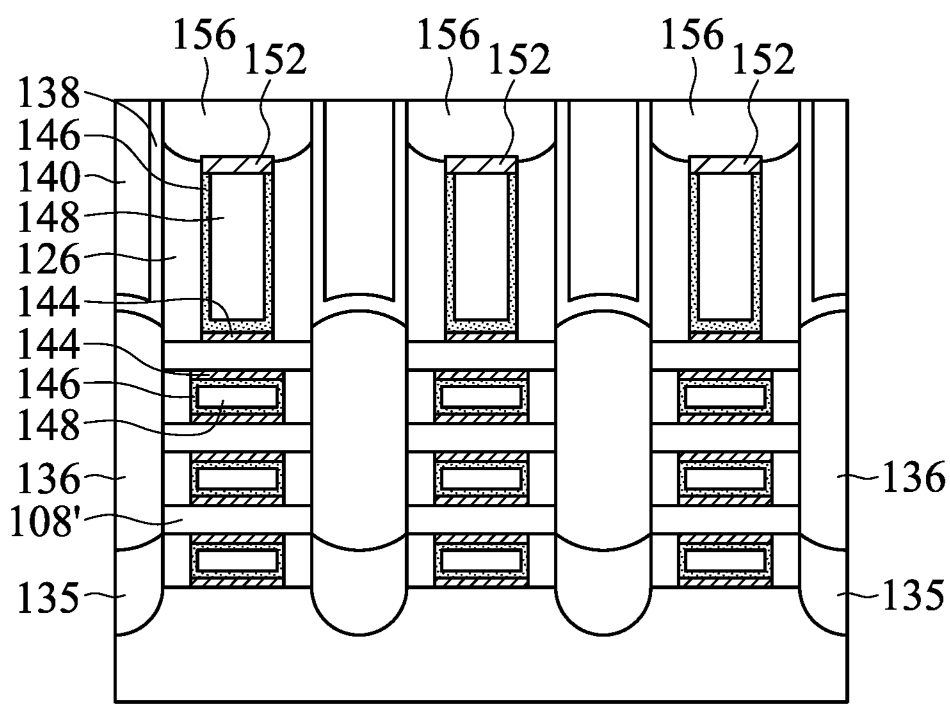
Figure 3B:
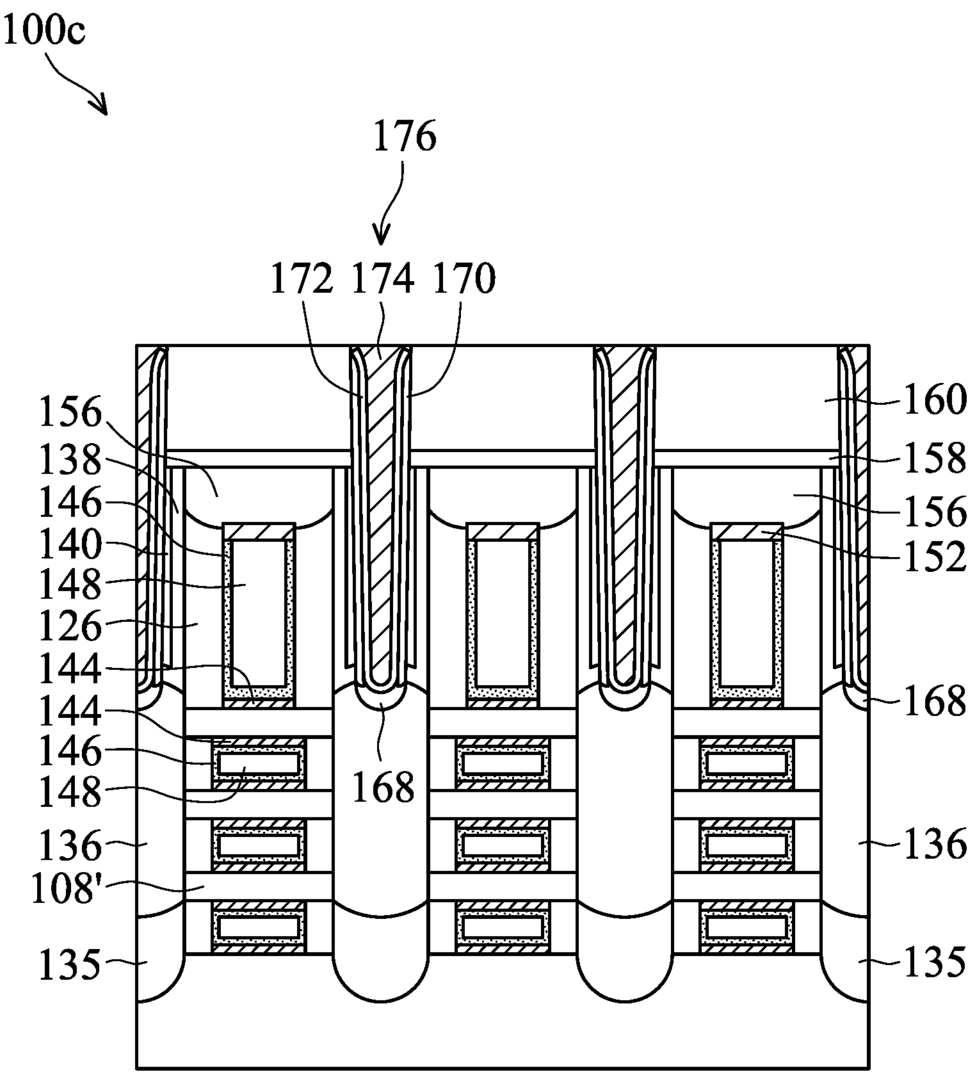
Figure 3C:
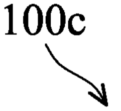
Figure 3C:
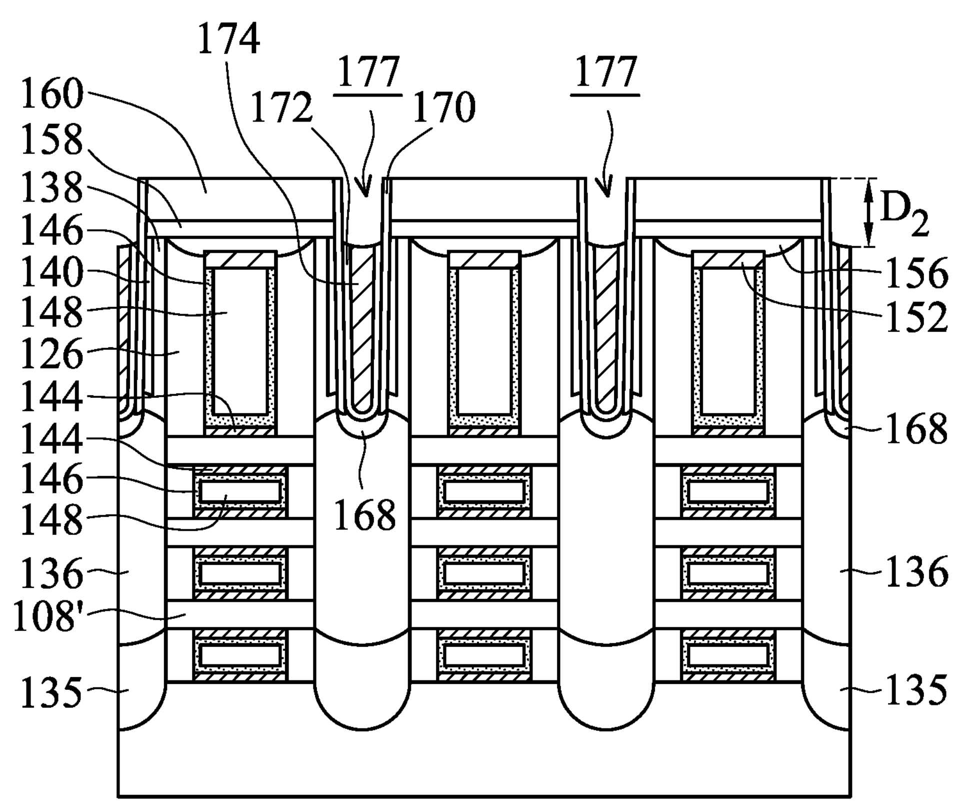
Figure 3D:
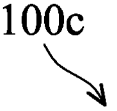
Figure 3D:
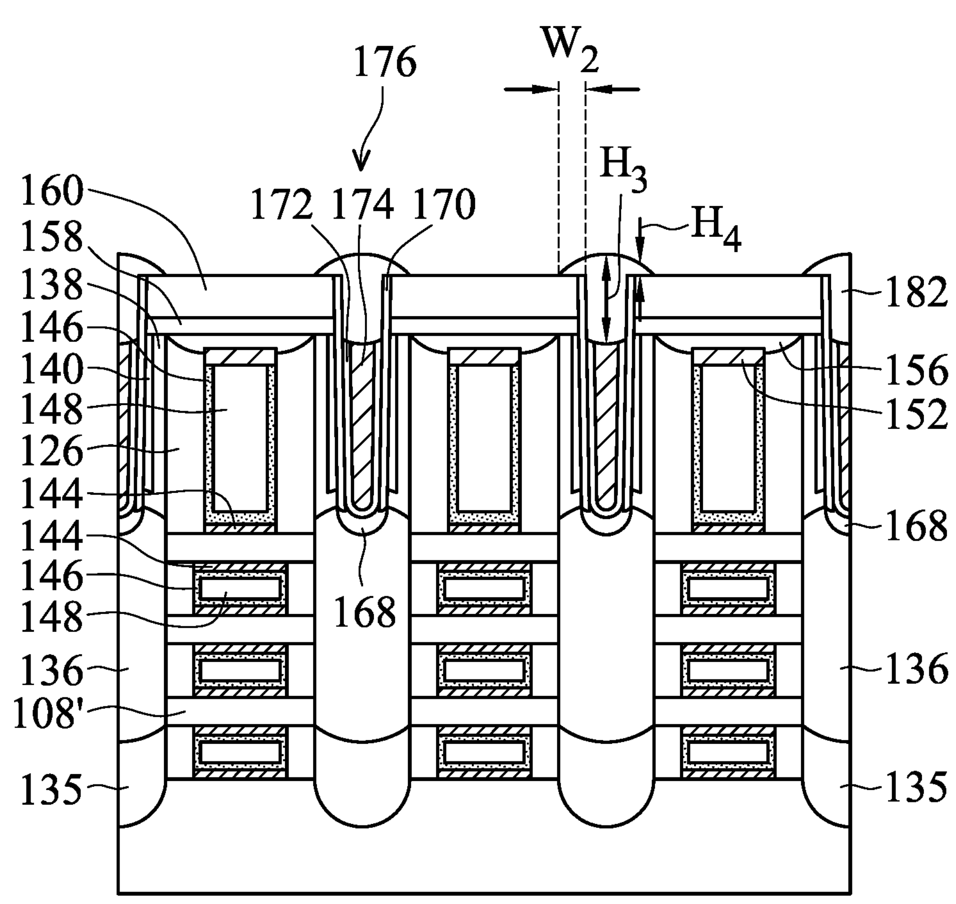
Figure 3E:
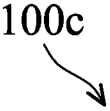
Figure 3E:
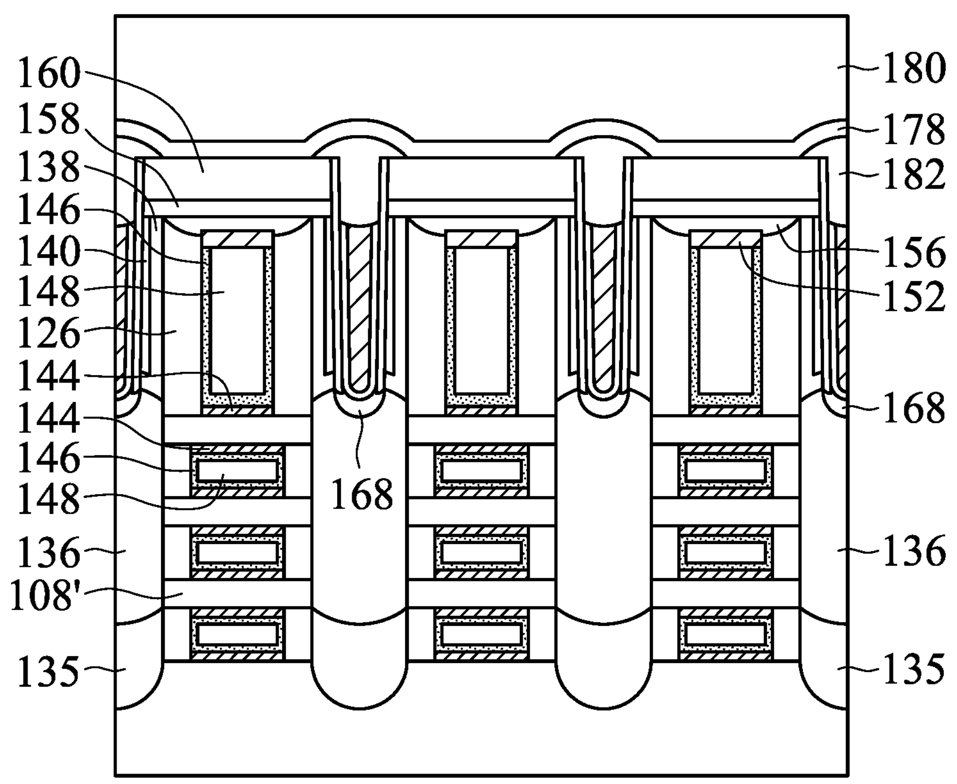
Figure 3F:
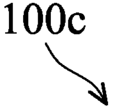
Figure 3F:
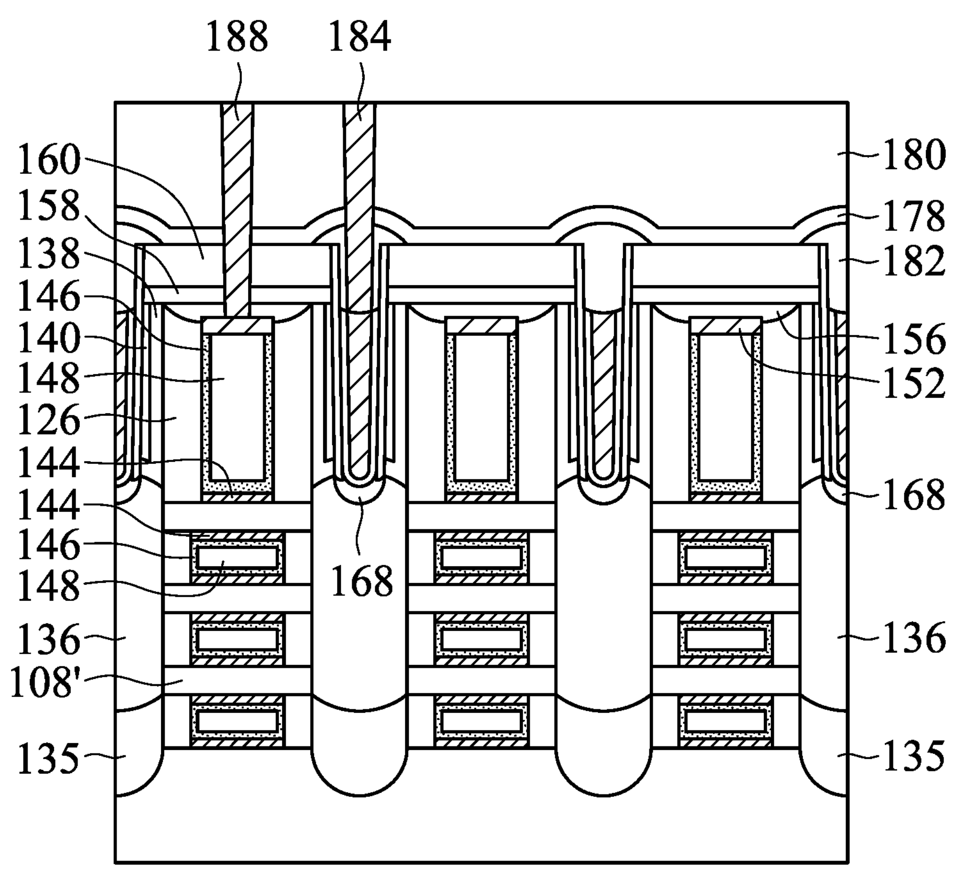

FIGS. 3A to 3F show cross-sectional representations of various stages of forming a semiconductor structure **100*c*, in accordance with some embodiments. The semiconductor device structure 100*b* of FIG. 3F includes elements that are similar to, or the same as, elements of the semiconductor device structure 100*a* of FIG. 2N, the difference between FIG. 3F and FIG. 2N is that, the S/D mask layer 182 with seam-free or void-free structure is formed over the S/D contact structure 176**.

As shown in FIG. 3A, the gate mask layer 156 is formed over the conductive cap layer 152, in accordance with some embodiments. The gate mask layer 156 is also formed over the gate spacer 126. The gate mask layer 156 has the recessed bottom surface. In some embodiments, the gate mask layer 156 has the concave bottom surface. The gate mask layer 156 has a substantially planar top surface.

Next, as shown in FIG. 3B, the etching stop layer 158 is formed over the gate mask layer 156, and the dielectric layer 160 is formed over the etching stop layer 158, in accordance with some embodiments. Afterwards, the S/D contact structure 176 is formed over the S/D structure 136.

The silicide layer 168 is formed on the S/D structure 136, and the S/D contact structure 176 includes the barrier layer 170, the glue layer 172 and the conductive layer 174. The S/D contact structure 176 is electrically connected to the S/D structure 136.

Afterwards, as shown in FIG. 3C, a top portion of the S/D contact structure 176 is removed to form a trench 177, in accordance with some embodiments. As a result, the topmost surface of the conductive layer 174 of the S/D contact structure 176 is lower than the top surface of the dielectric layer 160.

It should be noted that a portion of the conductive layer 174 and a portion of the glue layer 172 are removed, but the barrier layer 170 is not removed. Therefore, the top surface of the barrier layer 170 is higher than the bottom surface of the trench 177. In other words, the bottom surface of the trench 177 is lower than the top surface of the dielectric layer 160.

The trench 177 has a second depth $D_2$ which is measured from the top surface of the gate spacer 126 to the bottommost surface of the trench 177. In some embodiments, the second depth $D_2$ of the trench 177 is 1 nm to 10 nm.

Next, as shown in FIG. 3D, an S/D mask layer 182 is filled into the trench 177 and over the barrier layer 170 and the dielectric layer 160, in accordance with some embodiments. The S/D mask layer 182 extends from the first position to the second position, the first position is at the top surface of the conductive layer 174 of the S/D contact structure 176, and the second position is at the top surface of the dielectric layer 160.

The S/D mask layer 182 is formed on the top surface and the sidewall of the barrier layer 170. In addition, the S/D mask layer 182 covers a portion of the dielectric layer 160. More specifically, the S/D mask layer 182 covers a portion of the top surface of the dielectric layer 160.

The S/D mask layer 182 has a protruding portion which is higher than the top surface of the dielectric layer 160. The S/D mask layer 182 has the convex top surface. The bottom surface of the S/D mask layer 182 is lower than the top surface of the barrier layer 170.

The S/D mask layer 182 has a middle portion and a sidewall portion, the middle portion has a third height $H_3$, and the sidewall portion has a fourth height $H_4$. The third height $H_3$ is greater than the fourth height $H_4$. The S/D mask layer 182 has a lateral thickness $W_2$ which is laterally formed on the top surface of the gate spacer 126 in a horizontal direction. In some embodiments, the third height $H_3$ of the S/D mask layer 182 is 1 nm to 15 nm. In some embodiments, the lateral thickness $W_2$ of the S/D mask layer 182 is 1 nm to 10 nm.

In some embodiments, the S/D mask layer 182 is made of SiOx, SiOC, AlxOy, AlON, ZrO, HfO, TiO, ZrAlO, ZnO, SiOCN, SiOCN, SiCN or another applicable material. In some embodiments, the S/D mask layer 182 is formed by a deposition process, such as chemical vapor deposition (CVD), physical vapor deposition, (PVD), atomic layer deposition (ALD), or another applicable processes.

The material and formation process for forming the S/D mask layer 182 is similar to, or the same as, that for forming the gate mask layer 156. In some embodiments, the S/D mask layer 182 is formed by a bottom up process, such as ALD process. Therefore, the S/D mask layer 182 has a seam-free or void-free structure.

Next, as shown in FIG. 3E, the etching stop layer 178 is formed over the S/D contact structure 176, and the dielectric layer 180 is formed over the etching stop layer 178, in accordance with some embodiments.

Next, as shown in FIG. 3F, the S/D conductive via 184 is formed over the S/D contact structure 176, and the gate conductive via 188 is formed over the conductive cap layer 152, in accordance with some embodiments.

The S/D conductive via 184 passes through the S/D mask layer 182. The S/D conductive via 184 is electrically connected to the S/D structure 136 by the S/D contact structure 176. The gate conductive via 188 passes through the gate mask layer 156 and is electrically connected to the gate structure 140 by the conductive cap layer 152.

Since the S/D mask layer 182 is formed by the bottom up process, the S/D mask layer 182 has a seam-free or void-free structure. In addition, since the S/D mask layer 182 has seam-free or void-free structure, removing a portion of the S/D mask layer 182 to form the S/D conductive via 184 becomes easier (compared with removing the S/D mask layer 182 with seam or void), and therefore the reliability of the S/D conductive via 184 is improved. Therefore, performance of the semiconductor structure 100*c* is improved.

Figure 4A:
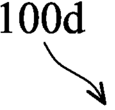
FIGS. 4A to 4E show cross-sectional representations of various stages of forming a semiconductor structure, in accordance with some embodiments.
Figure 4A:
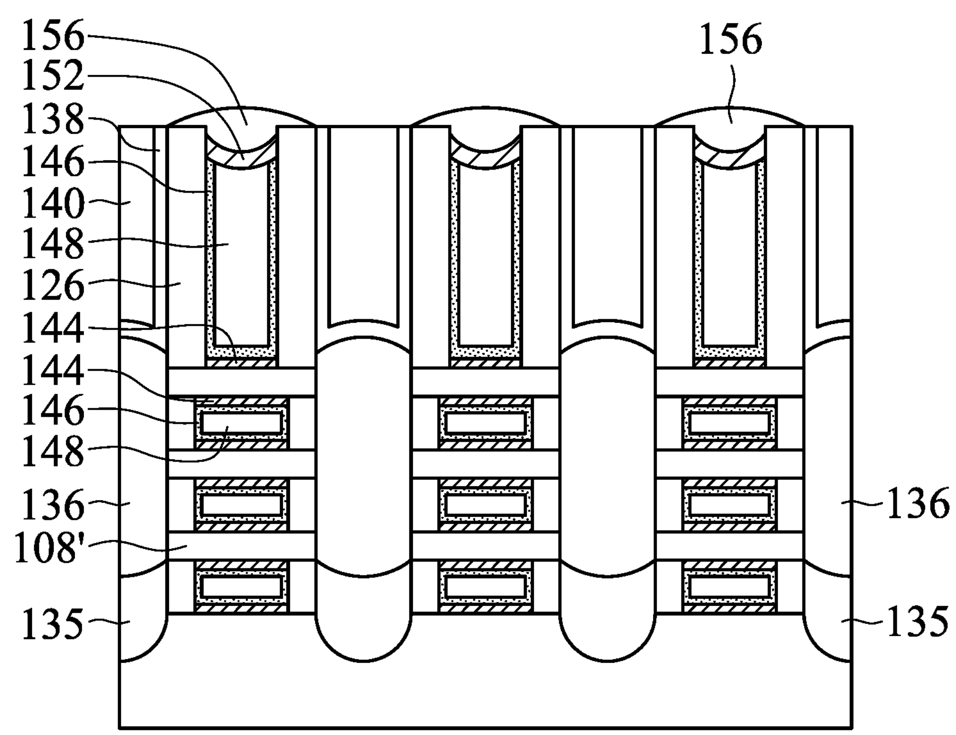
Figure 4B:
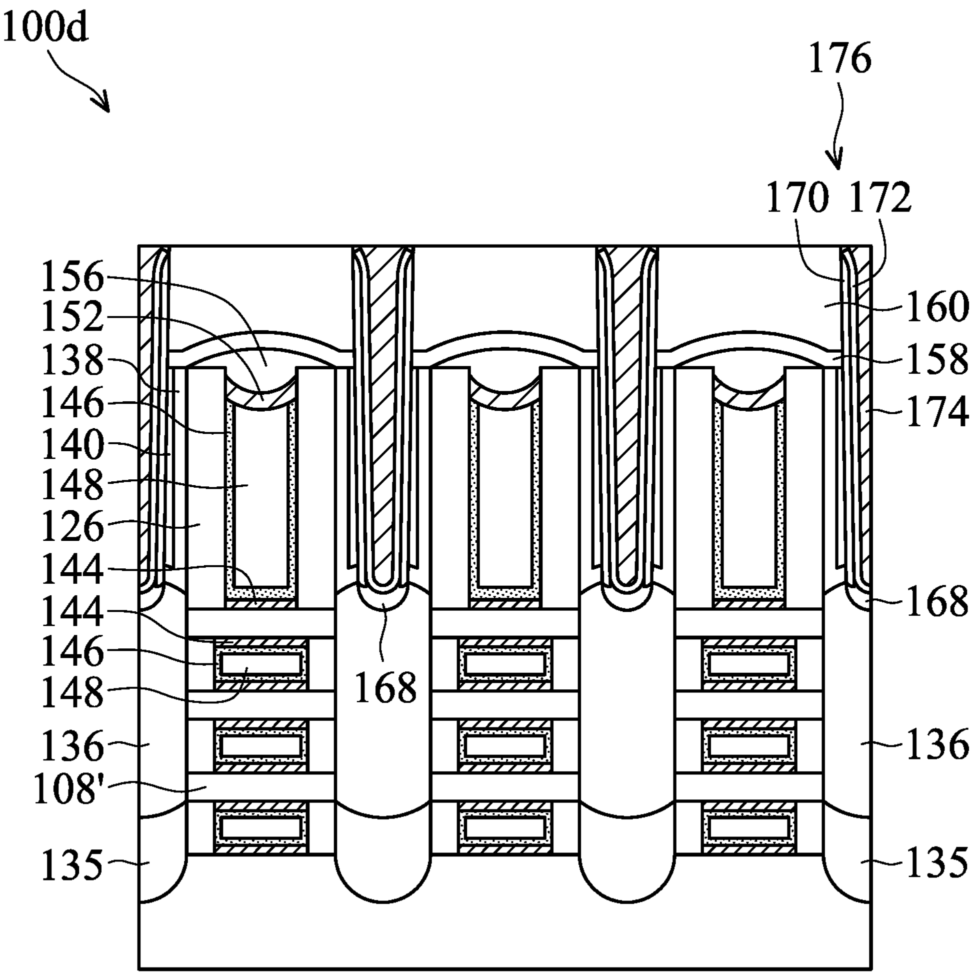
Figure 4C:
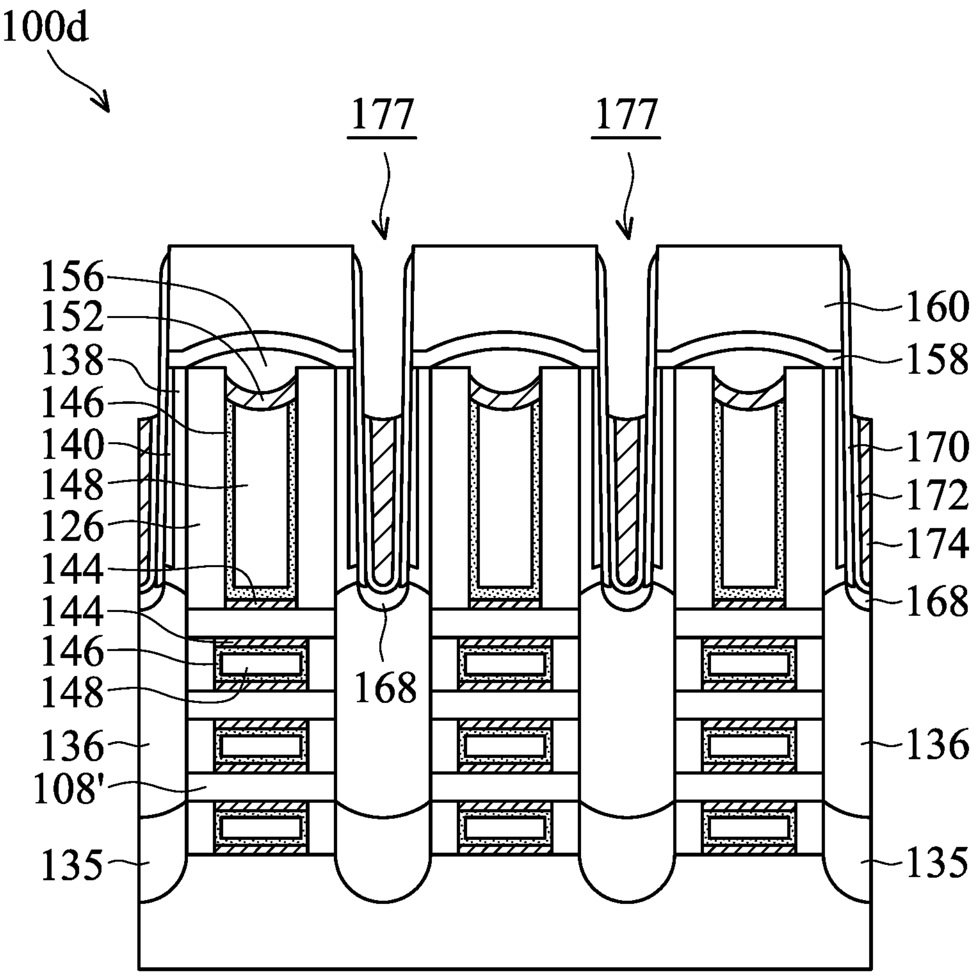
Figure 4D:
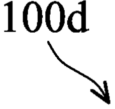
Figure 4D:
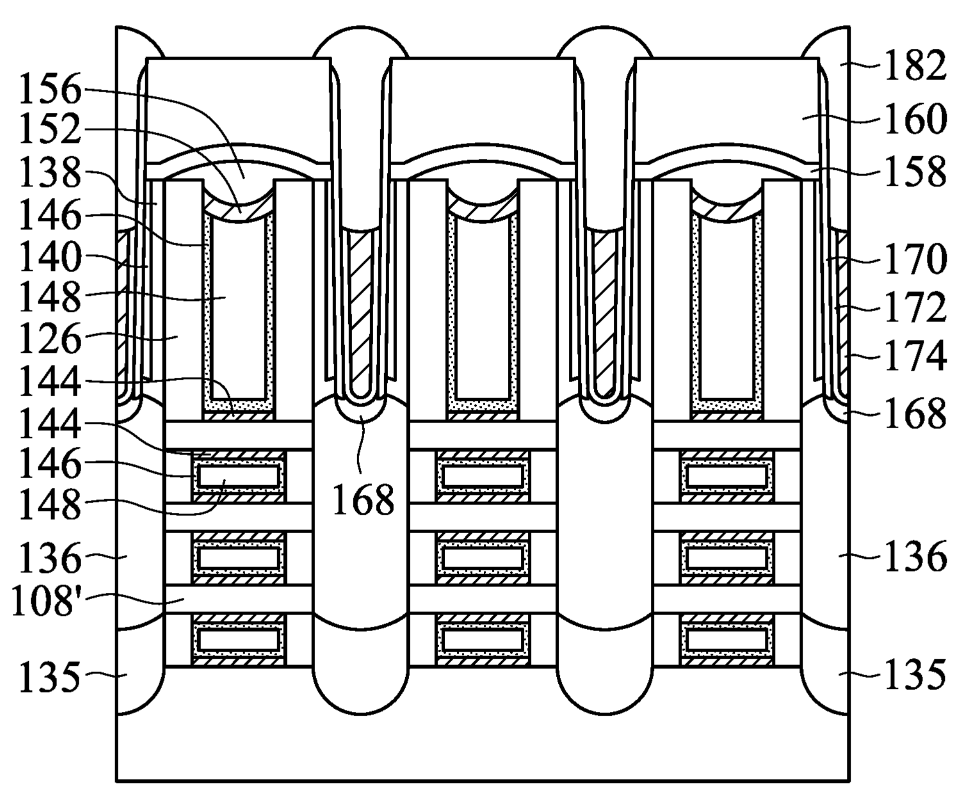
Figure 4E:
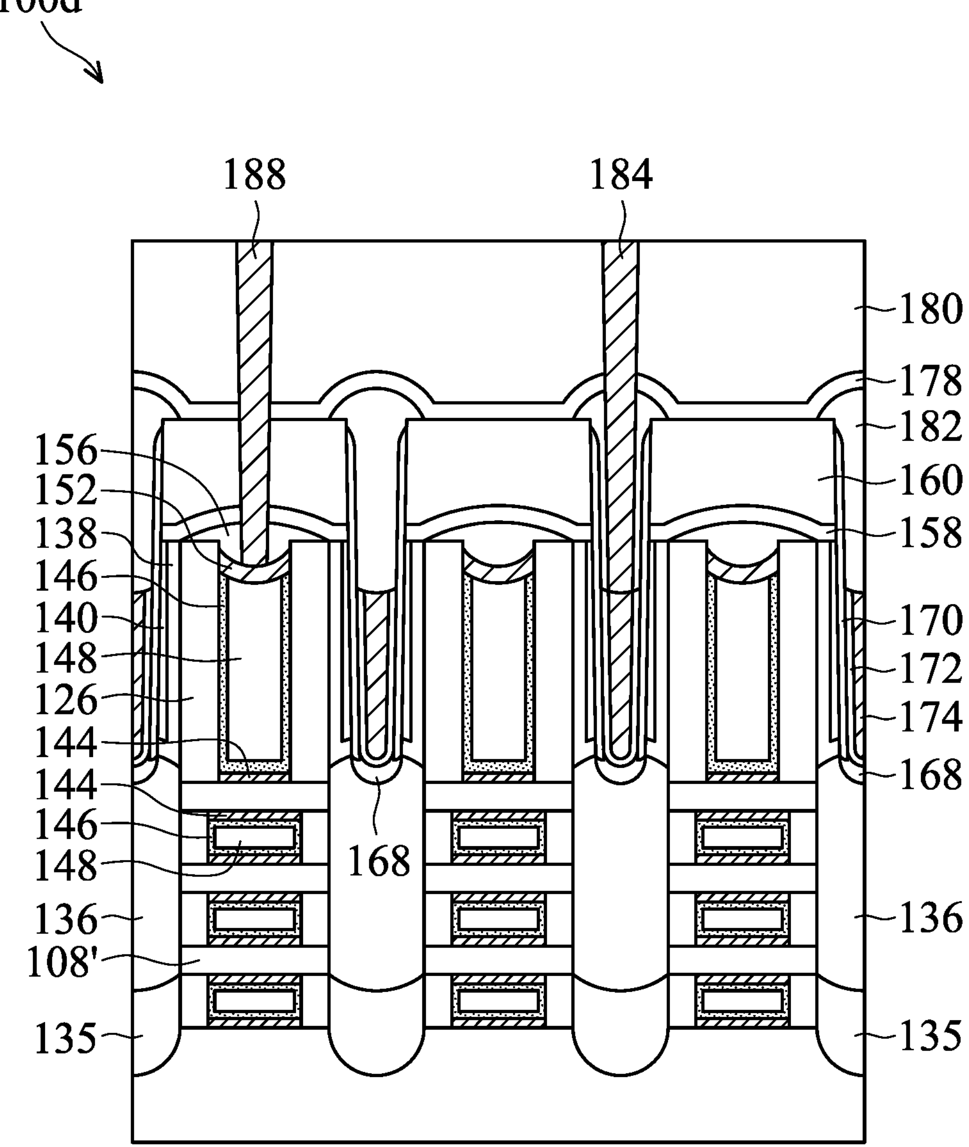

FIGS. 4A to 4E show cross-sectional representations of various stages of forming a semiconductor structure 100*d*, in accordance with some embodiments. The semiconductor device structure 100*d* of FIG. 4E includes elements that are similar to, or the same as, elements of the semiconductor device structure 100*a* of FIG. 2N, the difference between FIG. 4E and FIG. 2N is that, the S/D mask layer 182 is formed over the S/D contact structure 176.

As shown in FIG. 4A, the gate mask layer 156 is formed on the conductive cap layer 152, in accordance with some embodiments. The gate mask layer 156 has convex top surface and concave bottom surface. The top surface of the gate mask layer 156 is higher than the top surface of the etching stop layer 138, and higher than the top surface of the ILD layer 140.

Next, as shown in FIG. 4B, the etching stop layer 158 is formed over the gate mask layer 156, the gate spacer 126, the etching stop layer 138 and the ILD layer 140, in accordance with some embodiments. Next, the dielectric layer 160 is formed over the etching stop layer 158. Afterwards, the S/D contact structure 176 is formed over the silicide layer 168. The S/D contact structure 176 includes the barrier layer 170, the glue layer 172 and the conductive layer 174. The S/D contact structure 176 is electrically connected to the S/D structure 136 by the silicide layer 168.

Afterwards, as shown in FIG. 4C, a top portion of the S/D contact structure 176 is removed to form the trench 177, in accordance with some embodiments. As a result, the topmost surface of the conductive layer 174 of the S/D contact structure 176 is lower than the top surface of the dielectric layer 160.

Next, as shown in in FIG. 4D, the S/D mask layer 182 is filled into the trench 177 and over the barrier layer 170 and the dielectric layer 160, in accordance with some embodiments. The S/D mask layer 182 is formed on the top surface and the sidewall of the barrier layer 170, in accordance with some embodiments.

Afterwards, as shown in FIG. 4E, the etching stop layer 178 is formed over the S/D contact structure 176, and the dielectric layer 180 is formed over the etching stop layer 178, in accordance with some embodiments. The S/D conductive via 184 is formed over the S/D contact structure 176, and the gate conductive via 188 is formed over the conductive cap layer 152. The S/D conductive via 184 is electrically connected to the S/D structure 136 by the S/D contact structure 176. The gate conductive via 188 is electrically connected to the gate structure 140 by the conductive cap layer 152.

Figure 5:
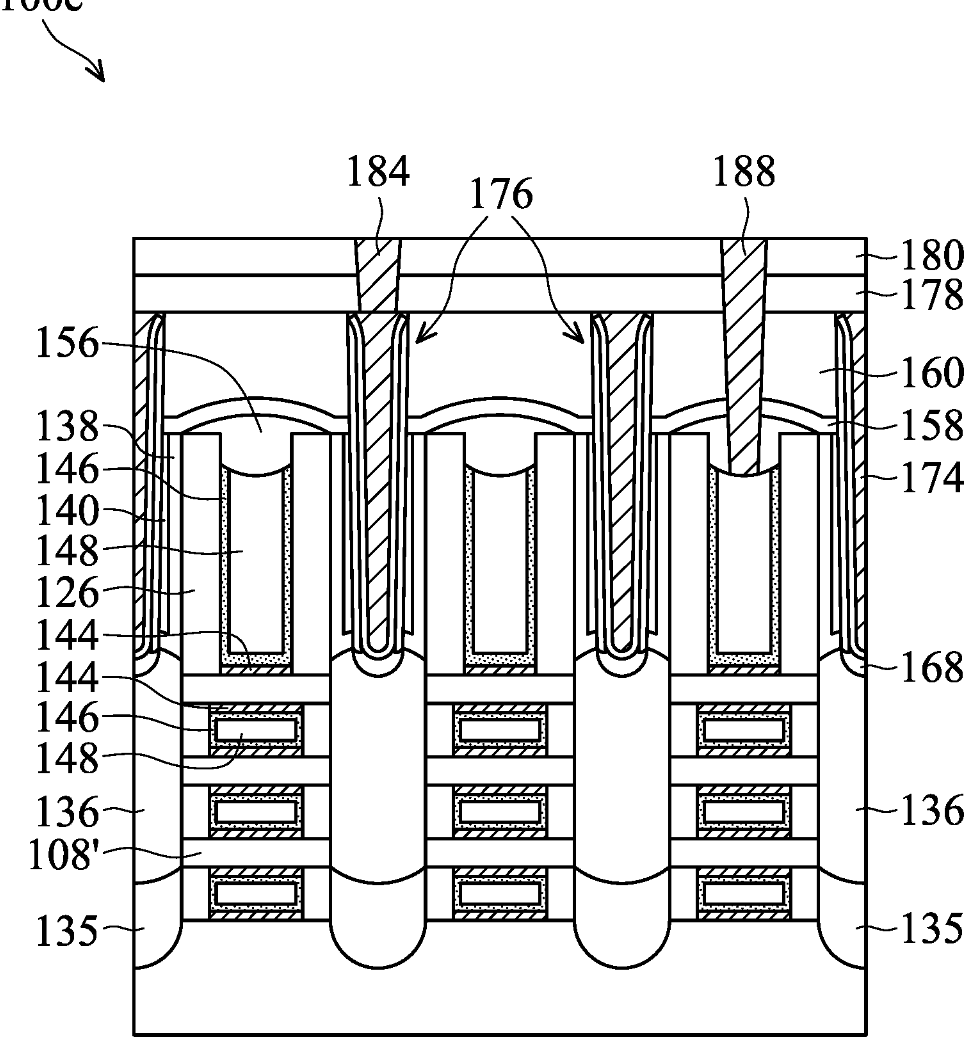
FIG. 5 shows a cross-sectional representation of a semiconductor structure, in accordance with some embodiments.

FIG. 5 shows a cross-sectional representation of a semiconductor structure 100*e*, in accordance with some embodiments. The semiconductor device structure 100*e* of FIG. 5 includes elements that are similar to, or the same as, elements of the semiconductor device structure 100*a* of FIG. 2N, the difference between FIG. 5 and FIG. 2N is that, no conductive cap layer is formed below the gate mask layer 156.

Figure 6:
FIG. 6 shows a cross-sectional representation of a semiconductor structure, in accordance with some embodiments.
Figure 6:
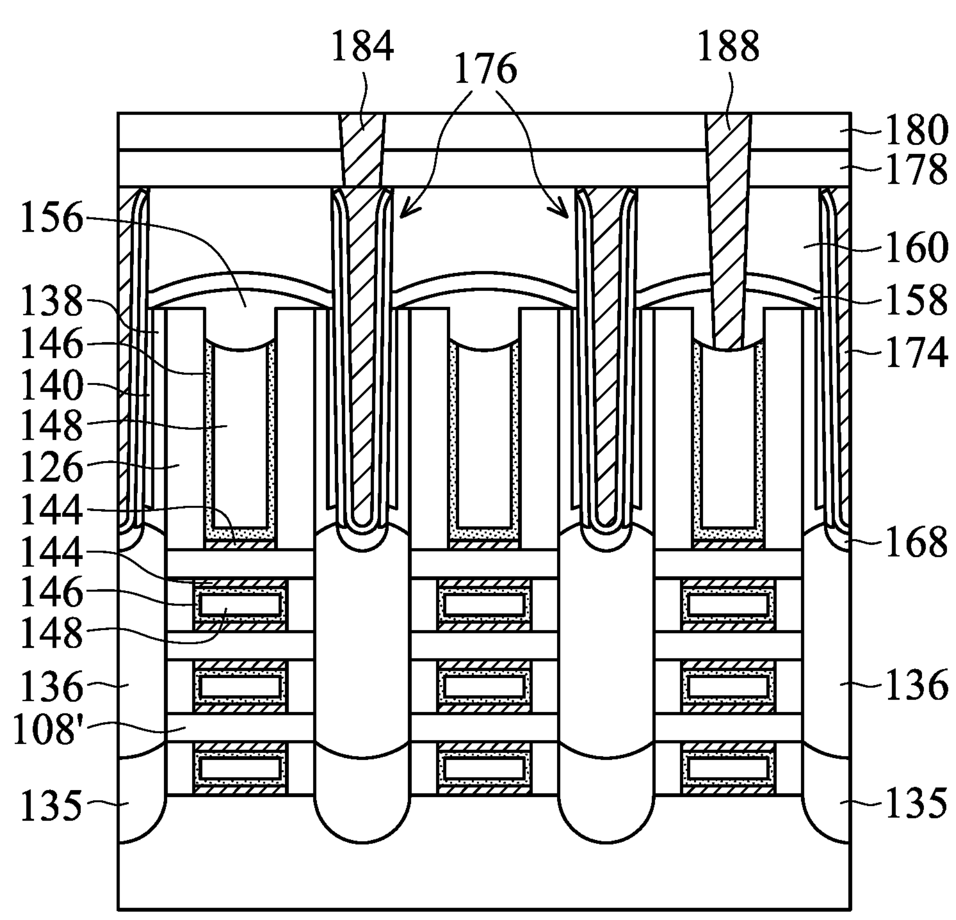

FIG. 6 shows a cross-sectional representation of a semiconductor structure 100*f*, in accordance with some embodiments. The semiconductor device structure 100*f* of FIG. 6 includes elements that are similar to, or the same as, elements of the semiconductor device structure 100*b* of FIG. 2N', the difference between FIG. 6 and FIG. 2N' is that, no conductive cap layer is formed below the gate mask layer 156.

Figure 7:
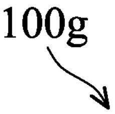
FIG. 7 shows a cross-sectional representation of a semiconductor structure, in accordance with some embodiments.
Figure 7:
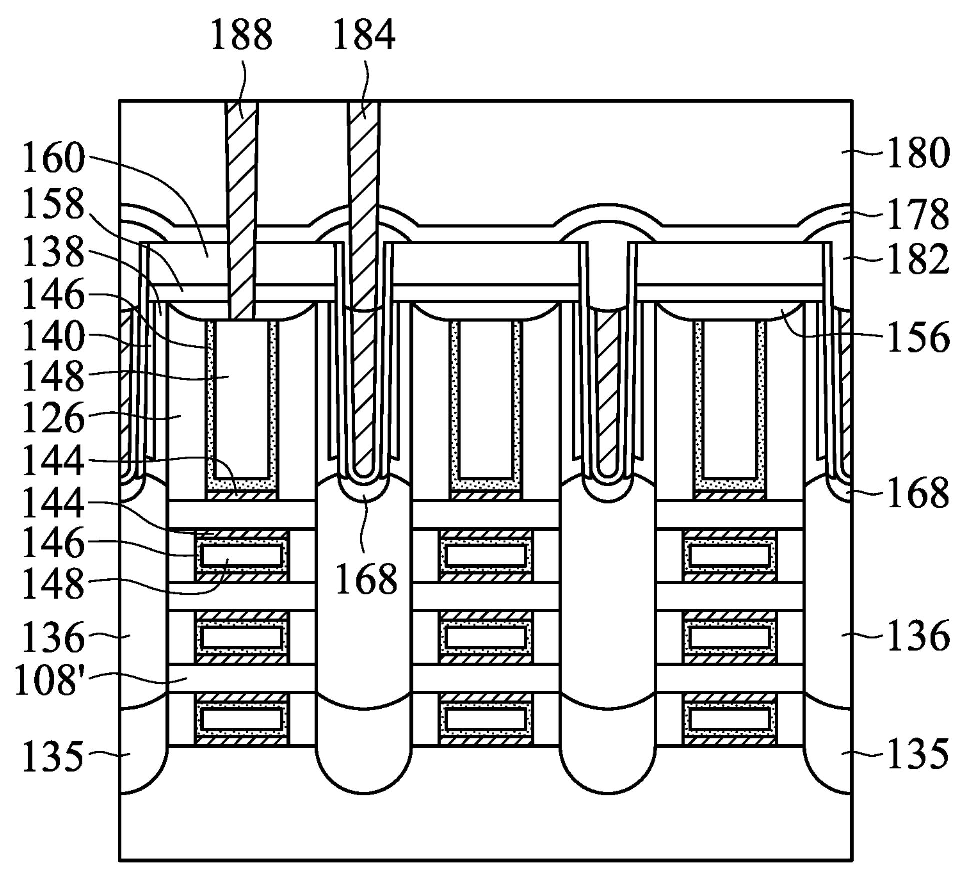

FIG. 7 shows a cross-sectional representation of a semiconductor structure 100*g*, in accordance with some embodiments. The semiconductor device structure 100*g* of FIG. 7 includes elements that are similar to, or the same as, elements of the semiconductor device structure 100*c* of FIG. 3F, the difference between FIG. 7 and FIG. 3F is that, no conductive cap layer is formed below the gate mask layer 156.

Figure 8:
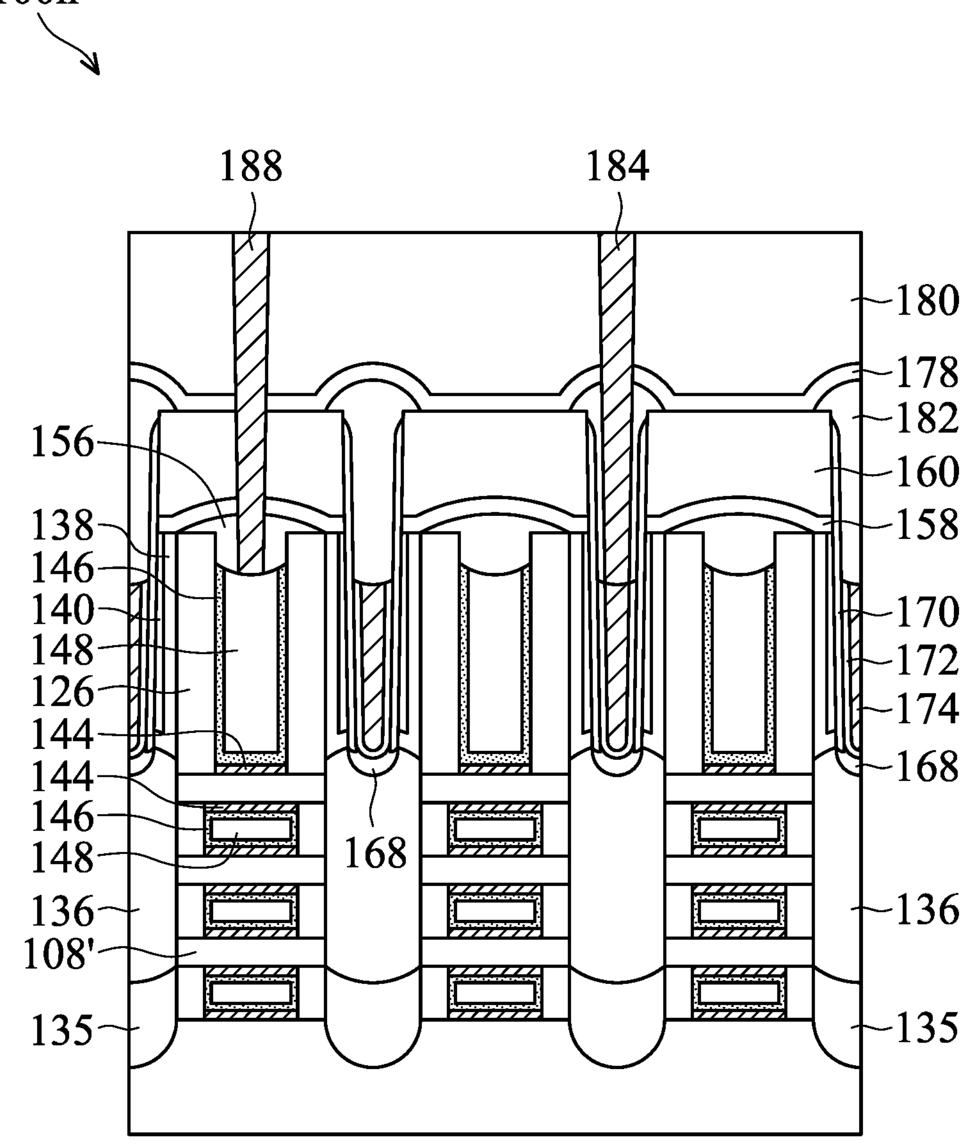
FIG. 8 shows a cross-sectional representation of a semiconductor structure, in accordance with some embodiments.

FIG. 8 shows a cross-sectional representation of a semiconductor structure 100*h*, in accordance with some embodiments. The semiconductor device structure 100*h* of FIG. 8 includes elements that are similar to, or the same as, elements of the semiconductor device structure 100*d* of FIG. 4E, the difference between FIG. 8 and FIG. 4E is that, no conductive cap layer is formed below the gate mask layer 156.

Figure 9:
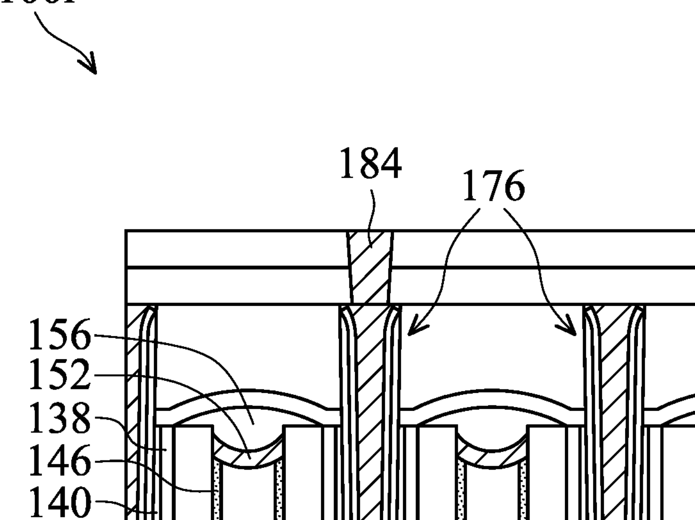
FIG. 9 shows a cross-sectional representation of a semiconductor structure, in accordance with some embodiments.

FIG. 9 shows a cross-sectional representation of a semiconductor structure 100*i*, in accordance with some embodiments. The semiconductor device structure 100*i* of FIG. 9 includes elements that are similar to, or the same as, elements of the semiconductor device structure 100*a* of FIG. 2N, the difference between FIG. 9 and FIG. 2N is that, the semiconductor structure 100*i* is a FinFET structure in accordance with some embodiments. Materials and processes for forming the semiconductor structure 100*i* may be similar to, or the same as, those for forming the semiconductor structure 100*a* described above and are not repeated herein. More specifically, a fin structure 204 is formed protruding from the substrate 102 and the gate structure 142 is formed across the fin structure 204, as shown in FIG. 9, in accordance with some embodiments.

It should be appreciated that the semiconductor structures 100*a* to 100*h* having the gate mask layer 156 and the S/D mask layer 182 described above may also be applied to FinFET structures, similar to that shown in FIG. 9, although not shown in the figures.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a gate structure, a source/drain (S/D) structure adjacent to the gate structure, and an S/D contact structure over the S/D structure. A gate mask layer is formed over the gate structure, and the gate mask layer is formed by a bottom up process, such as ALD process. In addition, an S/D mask layer is formed over the S/D contact structure, and the S/D mask layer is also formed by bottom up process, such as ALD process. Therefore, no seam or void is formed in the gate mask layer and the S/D mask layer and the performance of the semiconductor structure is improved.

In some embodiments, a semiconductor structure is provided. The semiconductor structure includes a gate structure formed over a substrate, and a source/drain (S/D) structure formed adjacent to the gate structure. The semiconductor structure includes a gate spacer formed adjacent to the gate structure, and an etching stop layer adjacent to the gate spacer. The semiconductor structure also includes a gate mask layer formed over the gate structure. The topmost surface of the gate mask layer is higher than the top surface of the etching stop layer.

In some embodiments, a semiconductor structure is provided. The semiconductor structure includes a gate structure formed over a substrate, and a source/drain (S/D) structure formed adjacent to the gate structure. The semiconductor structure also includes a gate spacer formed adjacent to the gate structure, and a gate mask layer formed over the gate structure and the gate spacer. The semiconductor structure includes a dielectric layer formed over the gate mask layer, and an S/D contact structure formed over the S/D structure and through the dielectric layer. The semiconductor structure includes an S/D mask layer formed over the S/D contact structure. The S/D mask layer extends from a first position to a second position. The first position is at the top surface of the conductive layer of the S/D contact structure, and the second position is at the top surface of the dielectric layer.

In some embodiments, a method for forming a semiconductor structure is provided. The method includes forming a gate structure over a substrate, and forming a gate spacer adjacent to the gate structure. The method also includes removing a portion of the gate structure to form an opening, and forming a gate mask layer in the opening and over the gate spacer. The method includes forming a source/drain (S/D) structure adjacent to the gate structure, and forming an S/D contact structure over the S/D structure. The method includes removing a portion of the S/D contact structure to form a trench, and forming an S/D mask layer in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a gate structure formed over a substrate;

a source/drain (S/D) structure formed adjacent to the gate structure;

an isolation layer below the S/D structure, wherein the isolation layer is between the substrate and the S/D structure;

a gate spacer formed adjacent to the gate structure;

an etching stop layer adjacent to the gate spacer;

a conductive cap layer formed over the gate structure, wherein the conductive cap layer has a recessed top surface, and the recessed top surface is lower than a top surface of the gate spacer; and a gate mask layer formed over the gate structure and the conductive cap layer, wherein a topmost surface of the gate mask layer is higher than a topmost surface of the etching stop layer, and an entirety of the gate mask layer is higher than a top surface of the conductive cap layer.

2. The semiconductor structure as claimed in claim 1, wherein the conductive cap layer is below the gate mask layer.

3. The semiconductor structure as claimed in claim 2, further comprising:

a gate conductive via formed over the conductive cap layer, wherein the gate conductive via passes through the gate mask layer and is in direct contact with the conductive cap layer.

4. The semiconductor structure as claimed in claim 1, wherein the gate mask layer covers a portion of the etching stop layer.

5. The semiconductor structure as claimed in claim 1, further comprising:

a plurality of nanostructures formed below the gate structure.

6. The semiconductor structure as claimed in claim 1, further comprising:

a dielectric layer formed over the gate structure;

an S/D contact structure formed over the S/D structure and through the dielectric layer; and an S/D mask layer formed over the S/D contact structure, wherein the S/D mask layer covers a portion of the dielectric layer.

7. The semiconductor structure as claimed in claim 6, wherein the S/D contact structure comprises a barrier layer, wherein the S/D mask layer is formed on a sidewall and a top surface of the barrier layer.

8. The semiconductor structure as claimed in claim 1, wherein the gate mask layer has a middle portion and a sidewall portion, and the middle portion has a first height, the sidewall portion has a second height, and the first height is greater than the second height.

9. The semiconductor structure as claimed in claim 1, wherein the gate mask layer has a convex top surface and a convex bottom surface.

10. A semiconductor structure, comprising:

a gate structure formed over a substrate;

a source/drain (S/D) structure formed adjacent to the gate structure;

a gate spacer formed adjacent to the gate structure;

a gate mask layer formed over the gate structure and the gate spacer;

a dielectric layer formed over the gate mask layer;

an S/D contact structure formed over the S/D structure and through the dielectric layer; and an S/D mask layer formed over the S/D contact structure, wherein the S/D mask layer extends from a first position to a second position, the first position is at a top surface of a conductive layer of the S/D contact structure, and the second position is at a top surface of the dielectric layer, wherein the S/D mask layer covers a portion of a topmost horizontal surface of the dielectric layer, and a bottom surface of the S/D mask layer is lower than a bottom surface of the dielectric layer and higher than a top surface of the gate structure.

11. The semiconductor structure as claimed in claim 10, wherein the S/D contact structure comprises a barrier layer, wherein the S/D mask layer is formed on a sidewall and a top surface of the barrier layer.

12. The semiconductor structure as claimed in claim 11, wherein a bottom surface of the S/D mask layer is lower than the top surface of the barrier layer.

13. The semiconductor structure as claimed in claim 10, wherein the S/D mask layer has a convex top surface.

14. The semiconductor structure as claimed in claim 10, further comprising:

a gate conductive via formed over the gate structure, wherein the gate conducive via passes through the gate mask layer; and an S/D conductive via formed over the S/D contact structure, wherein the S/D conductive via passes through the S/D mask layer.

15. A method for forming a semiconductor structure, comprising:

forming a gate structure over a substrate, wherein the gate structure comprises a gate dielectric layer and a gate electrode layer over the gate dielectric layer;

forming a gate spacer adjacent to the gate structure;

removing a portion of the gate structure to form an opening;

forming a conductive cap layer in the opening and on the gate dielectric layer, wherein a top surface of the gate dielectric layer is covered by the conductive cap layer and is interfacing with the conductive cap layer, and the conductive cap layer has a recessed top surface, and the recessed top surface is lower than a top surface of the gate spacer;

forming a gate mask layer over the conductive cap layer, wherein a bottom surface of the conductive cap layer is lower than a bottom surface of the gate mask layer;

forming a source/drain (S/D) structure adjacent to the gate structure;

forming an S/D contact structure over the S/D structure;

removing a portion of the S/D contact structure to form a trench; and forming an S/D mask layer in the trench.

16. The method for forming the semiconductor structure as claimed in claim 15, wherein forming the gate mask layer is by an atomic layer deposition (ALD) process, and forming the S/D mask layer is by an atomic layer deposition (ALD) process.

17. The method for forming the semiconductor structure as claimed in claim 15, further comprising:

performing an implantation process on the gate mask layer.

18. The method for forming the semiconductor structure as claimed in claim 15, wherein forming the S/D contact structure further comprises:

forming a barrier layer; and forming a conductive layer on the barrier layer, wherein a bottom surface of the S/D mask layer is lower than a top surface of the barrier layer.

19. The method for forming the semiconductor structure as claimed in claim 15, further comprising:

forming an etching stop layer adjacent to the gate spacer; and forming the gate mask layer over a top surface of the etching stop layer.

20. The method for forming the semiconductor structure as claimed in claim 15, further comprising:

forming a dielectric layer over the S/D structure;

forming the S/D contact structure through the dielectric layer; and removing the portion of the S/D contact structure to form the trench, wherein a bottom surface of the trench is lower than a top surface of the dielectric layer.

* * * * *